US011985836B2

(12) United States Patent
Zhu et al.

(10) Patent No.: US 11,985,836 B2
(45) Date of Patent: May 14, 2024

(54) METHODS FOR MANUFACTURING HIGHLY EFFICIENT WIDE-GAP PEROVSKITE SOLAR CELLS

(71) Applicant: Alliance for Sustainable Energy, LLC, Golden, CO (US)

(72) Inventors: Kai Zhu, Littleton, CO (US); Qi Jiang, Golden, CO (US); Jinhui Tong, Wuhan (CN)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 18/177,232

(22) Filed: Mar. 2, 2023

(65) Prior Publication Data

US 2023/0284468 A1  Sep. 7, 2023

Related U.S. Application Data

(60) Provisional application No. 63/386,556, filed on Dec. 8, 2022, provisional application No. 63/315,834, filed on Mar. 2, 2022.

(51) Int. Cl.
*H10K 30/57* (2023.01)
*H01G 9/00* (2006.01)
(Continued)

(52) U.S. Cl.
CPC ........... *H10K 30/57* (2023.02); *H01G 9/0036* (2013.01); *H01G 9/2009* (2013.01); *H10K 71/16* (2023.02)

(58) Field of Classification Search
CPC ........ H10K 30/57; H10K 30/10; H10K 71/16; H10G 9/0036; H10G 9/2009
See application file for complete search history.

(56) References Cited

U.S. PATENT DOCUMENTS

2016/0020411 A1\* 1/2016 Lee ................... H10K 30/151
438/82
2018/0351019 A1\* 12/2018 Zhu ........................ C07F 7/24
(Continued)

FOREIGN PATENT DOCUMENTS

WO       2016187340 A1    11/2016
WO    WO-2016187340 A1 \*  11/2016  ......... H01L 51/0007

OTHER PUBLICATIONS

Wang, Low-Temperature Processed, Efficient, and Highly Reproducible Cesium-Doped Triple Cation Perovskite Planar Heterojunction Solar Cells, Sol. RRL Feb. 2018, 1700209, pp. 1-8 (Year: 2018).\*

(Continued)

*Primary Examiner* — Devina Pillay
(74) *Attorney, Agent, or Firm* — Michael A. McIntyre

(57) ABSTRACT

The present disclosure relates to a device that includes a layer that includes a perovskite, where the layer has a first side and a second side defining a thickness, the perovskite has a bulk composition as defined by $AB(X_{1-y}X_y')_3$, where A includes a first cation, B includes a second cation, X includes iodide, and X' includes bromide, y is between 0.2 and 0.8, inclusively, and the thickness has a bromide concentration gradient across the thickness with a maximum concentration at or in the proximity of the first side and a minimum concentration at the second side.

19 Claims, 27 Drawing Sheets

(51) Int. Cl.
H01G 9/20 (2006.01)
H10K 71/16 (2023.01)

(56) References Cited

U.S. PATENT DOCUMENTS

2021/0125790 A1* 4/2021 Saidaminov ......... H10K 30/151
2023/0345745 A1 10/2023 Zheng

OTHER PUBLICATIONS

Al-Ashouri, Monolithic perovskite/silicon tandem solar cell with >29% efficiency by enhanced hole extraction, Al-Ashouri et al., Science 370, 1300-1309 (2020) (Year: 2020).*
Magomedov, Self-Assembled Hole Transporting Monolayer for Highly Efficient Perovskite Solar Cells, Adv. Energy Mater. Aug. 2018, 1801892, pp. 1-9 (Year: 2018).*
Abdi-Jalebi, M. et al., "Maximizing and stabilizing luminescence from halide perovskites with potassium passivation," Nature Letter, vol. 555, Mar. 22, 2018, 19 pages.
Bu, T. et al., "Structure engineering of hierarchical layered perovskite interface for efficient and stable wide bandgap photovoltaics," Nano Energy, vol. 75, 2020, 7 pages.
Chen, C. et al., "Achieving a high open-circuit voltage in inverted wide-bandgap perovskite solar cells with a graded perovskite homojunction," Nano Energy, vol. 61, 2019, 7 pages.
Chen, C. et al., "Arylammonium-Assisted Reduction of the Open-Circuit Voltage Deficit in Wide-Bandgap Perovskite Solar Cells: The Role of Suppressed Ion Migration," ACS Energy Letters, vol. 5, 2020, 9 pages.
Dai, X. et al., "Scalable Fabrication of Efficient Perovskite Solar Modules on Flexible Glass Substrates," Advanced Energy Materials, vol. 10, 2020, 7 pages.
Deng, Y. et al., "Tailoring solvent coordination for high-speed, room-temperature blading of perovskite photovoltaic films," Science Advances, vol. 5, 2019, 9 pages.
Deng, Y. et al., "Reduced Self-Doping of Perovskites Induced by Short Annealing for Efficient Solar Modules," Joule, vol. 4, Sep. 16, 2020, 12 pages.
Ding, J. et al., "Fully Air-Bladed High-Efficiency Perovskite Photovoltaics," Joule, vol. 3, Feb. 20, 2019, 15 pages.
Eperon, G.E. et al., "The Role Of Dimethylammonium in Bandgap Modulation for Stable Halide Perovskites," ACS Energy Letters, vol. 5, 2020, 9 pages.
Gharibzadeh, S. et al., "Record Open-Circuit Voltage Wide-Bandgap Perovskite Solar Cells Utilizing 2D/3D Perovskite Heterostructure," Advanced Energy Materials, vol. 9, 2019, 10 pages.
Gholipour, S. et al., "Globularity-Selected Large Molecules for a New Generation of Multication Perovskites," Advanced Materials, vol. 29, 2017, 9 pages.
Hoke, E.T. et al., "Reversible photo-induced trap formation in mixed-halide hybrid perovskites for photovoltaics," RSC Chemical Science, vol. 6, 2015, 5 pages.
Huang, F. et al., "Gas-assisted preparation of lead iodide perovskite films consisting of a monolayer of single crystalline grains for high efficiency planar solar cells," Nano Energy, vol. 10, 2014, 9 pages.
Jiang, Q. et al., "Surface reaction for efficient and stable inverted perovskite solar cells," Nature, vol. 611, Nov. 10, 2022, 8 pages.
Kim, D. et al., "Efficient, stable silicon tandem cells enabled by anion-engineered wide-bandgap perovskites," Science, vol. 368, 2020, 7 pages.
Kim, D. H. et al., Bimolecular Additives Improve Wide Band-Gap Perovskites for Efficient Tandem Solar Cells with CIGS,: Joule, vol. 3, Jul. 17, 2019, 12 pages.
Kim, J. et al., "Amide-Catalyzed Phase-Selective Crystallization Reduces Defect Density in Wide-Bandgap Perovskites," Advanced Materials, vol. 30, 2018, 6 pages.
Li, C. et al., "Reducing Saturation-Current Density to Realize High-Efficiency Low-Bandgap Mixed Tin-Lead Halide Perovskite Solar Cells," Advanced Energy Materials, vol. 9, 2019, 9 pages.
Li, Y. et al., "Perovskite-based Tandem Solar Cells," Perovskite Materials and Devices, First Edition, Edited by Liming Ding, 2022, 32 pages.
Liu, Z. et al., "Interface Optimization via Fullerene Blends Enables Open-Circuit Voltages of 1.25V in CH3NH3Pb (I0.8Br0.2)3 Solar Cells," Advanced Energy Materials, vol. 11, 2021, 13 pages.
McMeekin, D.P. et al., "A mixed-cation lead mixed halide perovskite absorber for tandem solar cells," Science, vol. 351, Issue 6269, Jan. 8, 2016, 6 pages.
Stoddard, R.J. et al., "Enhancing Defect Tolerance and Phase Stability of High-Bandgap Perovskites via Guanidinium Alloying," ACS Energy Letters, vol. 3, 2018, 8 pages.
Subbiah, A.S. et al., "High-Performance Perovskite Single-Junction and Textured Perovskite/Silicon Tandem Solar Cells via Slot-Die-Coating," ACS Energy Letters, vol. 5, 2020, 7 pages.
Tan, H. et al., "Dipolar cations confer defect tolerance in wide-bandgap metal halide perovskites," Nature Communications, vol. 9, 2018, 10 pages.
Tong, J. et al., "Carrier control in Sn-Pb perovskites via 2D cation engineering for all-perovskite tandem solar cells with improved efficiency and stability," Nature Energy, vol. 7, Jul. 2022, 10 pages.
Wang, J. et al., "Perovskite-based tandem solar cells gallop ahead," Joule, vol. 6, Mar. 16, 2022, 3 pages.
Wang, R. et al., "Prospects for metal halide perovskite-based tandem solar cells," Nature Photonics, vol. 15, Jun. 2021, 15 pages.
Yu, F. et al., "Efficient and Stable Wide-Bandgap Perovskite Solar Cells Derived from a Thermodynamic Phase-Pure Intermediate," Wiley, Solar RRL, vol. 6, 2022, 7 pages.
Yu, Y. et al., "Synergistic Effects of Lead Thiocyanate Additive and Solvent Annealing on the Performance of Wide-Bandgap Perovskite Solar Cells," ACS Energy Letters, vol. 2, 2017, 6 pages.
Zhou, Y. et al., "Composition-Tuned Wide Bandgap Perovskites: From Grain Engineering to Stability and Performance Improvement," Advanced Functional Materials, vol. 28, 2018, 8 pages.

* cited by examiner

A

α-ABX$_3$

B

β-ABX$_3$

C

γ-ABX$_3$

A

B

METHODS FOR MANUFACTURING HIGHLY EFFICIENT WIDE-GAP PEROVSKITE SOLAR CELLS

CROSS-REFERENCE TO RELATED APPLICATIONS

This application claims priority from U.S. Provisional Patent Application Nos. 63/315,834 and 63/386,556 filed on Mar. 2, 2022 and Dec. 8, 2022, respectively, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Perovskite solar cells (PSCs) have reached certified 25.5% power conversion efficiency (PCE) for single-junction devices. One strategy to further improve the device PCE is to use a tandem configuration where absorbers with two different bandgaps are paired to improve the utilization of solar light. Wide bandgap PSC performance is critical to the performance the tandem devices. Thus, there remains a need for perovskite compositions and methods of making the same, that enable higher efficiency tandem PSCs.

SUMMARY

An aspect of the present disclosure is a device that includes a layer that includes a perovskite, where the layer has a first side and a second side defining a thickness, the perovskite has a bulk composition as defined by $AB(X_{1-y}X_y')_3$, where A includes a first cation, B includes a second cation, X includes iodide, and X' includes bromide, y is between 0.2 and 0.8, inclusively, and the thickness has a bromide concentration gradient having a maximum concentration at or in the proximity of the first side and a minimum concentration at the second side. In some embodiments of the present disclosure, the thickness may be between 100 nm and 1500 nm.

In some embodiments of the present disclosure, the first cation includes at least one of methylammonium (MA), formamidinium (FA), dimethylammonium (DMA), guanidinium, cesium, and/or rubidium. In some embodiments of the present disclosure, B may include at least one of lead and/or tin. In some embodiments of the present disclosure, the perovskite may be characterized by a bandgap greater than 1.5 eV. In some embodiments of the present disclosure, the first side may have no visible perovskite grain boundaries with a characteristic grain length between 100 nm and 1 μm, when viewed by scanning electron microscopy. In some embodiments of the present disclosure, the layer may include perovskite grains oriented substantially across the thickness. In some embodiments of the present disclosure, the perovskite may be characterized by X-ray diffraction by the absence of peaks in at least one of a first range between 17 degrees 2θ and 26 degrees 2θ and/or a second range between 30 degrees 2θ and 33 degrees 2θ. In some embodiments of the present disclosure, the bromide concentration may be evident when testing the layer by transient absorption (TA).

In some embodiments of the present disclosure, the perovskite may include $FA_{1-a-b}Cs_aDMA_bPb(I_{1-y}Br_y)_3$, where a is between 0.01 and 0.7, inclusively, and b is between 0 and 0.2, inclusively. In some embodiments of the present disclosure, the device may further include a layer constructed of a self-assembling monolayer (SAM), where the perovskite layer and the SAM layer are positioned in parallel and in physical contact with each other, and the SAM includes at least one of MeO-2PACZ and/or Me-4PACZ. In some embodiments of the present disclosure, the SAM layer may include MeO-2PACZ and Me-4PACZ. In some embodiments of the present disclosure, the MeO-2PACz and the Me-4PACZ may be present at a molar ratio between 1:2 and 20:1.

An aspect of the present disclosure is a method that includes contacting a surface of a liquid layer with a gas, where the liquid layer includes a first cation (A), a second cation (B), iodide (X), and bromide (X'), the contacting results in the transforming of the liquid layer to a solid perovskite layer having a bulk composition defined by $AB(X_{1-y}X_y')_3$, and y is between 0.2 and 0.8, inclusively. In some embodiments of the present disclosure, the gas may include at least one of an inert gas and/or air. In some embodiments of the present disclosure, the gas may be provided at a temperature between 20° C. and 100° C. In some embodiments of the present disclosure, the gas may be provided at a supply pressure between 20 psig and 70 psig. In some embodiments of the present disclosure, where, at the start of the contacting, the liquid layer may be provided at a temperature between 20° C. and 100° C. In some embodiments of the present disclosure, the contacting may be performed for a period of time between 1 second and 1 hour. In some embodiments of the present disclosure, the period of time may be between 10 seconds and 100 seconds.

BRIEF DESCRIPTION OF THE DRAWINGS

Some embodiments are illustrated in referenced figures of the drawings. It is intended that the embodiments and figures disclosed herein are to be considered illustrative rather than limiting.

REFERENCE NUMERALS

Figure 1:
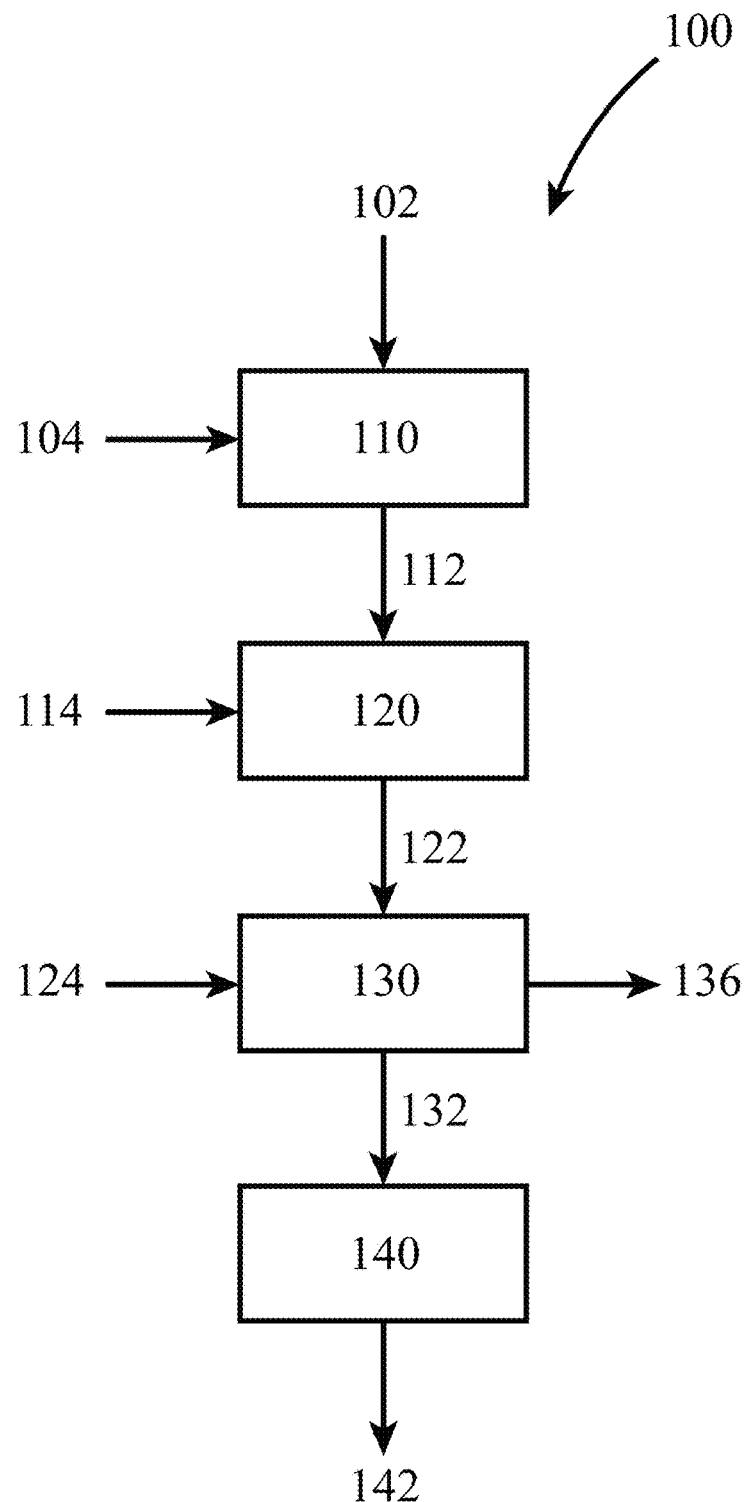
FIG. 1 illustrates a method for manufacturing a wide bandgap (WBG) perovskite layer, according to some embodiments of the present disclosure.

100 ... method
102 ... precursor stream with Br
104 ... solvent
110 ... preparing
112 ... perovskite precursor solution
114 ... substrate
120 ... applying
122 ... liquid layer
124 ... gas
130 ... contacting
132 ... intermediate solid perovskite layer
136 ... exit gas
140 ... heating
142 ... final solid perovskite layer
200 ... device
210 ... substrate
220 ... first contact
230 ... hole-transfer layer
240 ... perovskite
250 ... electron-transfer layer
260 ... second contact layer
300 ... perovskite
310 ... A-cation
320 ... B-cation
330 ... X-anion

DETAILED DESCRIPTION

The present disclosure relates to solution processing methods for manufacturing wide bandgap (WBG) perovskite solar cells that are characterized by superior physical properties and performance metrics, notably, among other things, excellent long-term stability. In brief, the manufacturing method, described in more detail below, combines the use of a perovskite precursor solution that contains bromide and a second halide with a gas contacting step. This combination results in the rapid preferential crystallization of bromide in the developing perovskite crystalline structure, ultimately resulting in a perovskite layer (i.e., film) characterized by, among other things, an essentially grain-boundary-free outer surface, with columnar grains in the thickness direction of the layer. The perovskite layer is also characterized by the presence of a bromide concentration gradient having a maximum bromide concentration at the outer surface that decreases as one moves across the thickness towards the substrate onto which the precursor solution was deposited. This method was used to prepare highly textured columnar 1.75-electron volt (eV) Br—I mixed WBG perovskite films having a reduced defect density, having excellent performance metrics, including a greater than 20% power conversion efficiency (PCE), open-circuit voltage ($V_{oc}$) of about ~1.33 V, and excellent operational stability (<5% degradation over 1100-hours operation under 1.2-sun at 65° C.). Such a WBG PCS was then combined with a 1.25-eV narrow-bandgap PSC, resulting in a 27.1%-efficient all-perovskite two-terminal tandem device with a high $V_{oc}$ of 2.2 V.

FIG. 1 illustrates a method 100 for manufacturing a WBG perovskite layer, according to some embodiments of the present disclosure. This exemplary method 100 begins with a preparing step 110 configured to prepare a perovskite precursor solution 112. For a solution processing method, such a preparing step 110 may include the mixing of one or more solvents with two or more perovskite precursors (e.g., $PbI_2$, $PbBr_2$, CsBr, etc.), resulting in a perovskite precursor solution 112 having the components and stoichiometry of components needed to produce the desired perovskite formulation. Examples of some suitable solvents 104 include dimethylformamide (DMF) dimethyl sulfoxide (DMSO), N-Methyl-2-pyrrolidone (NMP), gamma-butyrolactone (GBL), dimethylacetamide (DMAC), tetrahydrofuran (THF), 1,3-dimethyl-3,4,5,6-tetrahydro-2(1H)-pyrimidinone (DMPU), and/or 1,3-dimethyl-2-imidazolidinone (DMI). Note that FIG. 1, for simplicity only shows one precursor stream 102, although, in some embodiments of the present disclosure, more than one may be necessary. The precursor solution 112 resulting from the preparing step 110 may be subsequently applied in an applying step 120 to a substrate 114, resulting in the formation of a liquid layer 122 positioned on the substrate 114. This liquid layer 122 of perovskite precursor solution 112, positioned on the substrate 114, may then be exposed to a gas 124 in a contacting step 130, resulting in the removal of at least a portion of the solvent and the forming of an intermediate solid perovskite layer 132. Among other things, the gas contacting 130 results in the rapid and preferential formation of an intermediate solid perovskite layer 132 having a bromide-concentration gradient and defect-free surface, as described briefly above and in more detail below. In some embodiments of the present disclosure, the gas contacting 130 may result in the final target perovskite layer. However, in some embodiments of the present disclosure, an additional annealing step may be beneficial. Therefore, in some embodiments of the present disclosure, an intermediate solid perovskite layer 132 may be directed to a heating step 140, where the layer is heated at a temperature above ambient temperature to anneal the intermediate solid perovskite layer 132 into the final solid perovskite layer 142.

Referring again to FIG. 1, at least one of the perovskite precursors contained in a precursor stream 102 should contain a source of bromine. In some embodiments of the present disclosure, bromine may be provided in the form of a salt of a cation and bromide. Perovskites are described later in this disclosure in detail. However, in brief a perovskite may be described as crystal structure having a network of corner-sharing $BX_6$ octahedra resulting in the general stoichiometry of $ABX_3$, where A is a first cation, B is a second cation, and X is an anion. Examples of an anion (X) include one or more halides, such as bromide, iodide, and chloride. Examples of a second cation (B) include at least one of lead and/or tin. Examples of a first cation (A) include ammonium ions such as methylammonium (MA) and dimethylammonium (DMA), as well as other cations, including formamidinium and alkali metals such as cesium and rubidium. Thus, in order to form a perovskite, $ABX_3$, each of A, B, and X must be provided in the perovskite precursor solution 112 to the applying step 120, at the relative concentrations needed to construct the desired perovskite stoichiometry. Examples of perovskite precursors that may be used to accomplish this include two or more of various forms of AX and $BX_2$. Specific examples of perovskite precursors include MABr, FABr, DMABr, CsBr, RbBr, MAI, FAI, DMAI, CsI, RbI, MACl, FACl, DMACl, CsCl, RbCl, $PbBr_2$, $SnBr_2$, $PbI_2$, $SnI_2$, $PbCl_2$, and $SnCl_2$. Important for the synthesis of the bromide-containing perovskite layers described herein, is that the perovskite precursor solution 112 contain at least one source of bromide and at least one source of a second halide, for example iodide.

In the case of having two anions (X), a perovskite may be described as $AB(X_{1-y}X_y')_3$, where X' represents bromide and X represents a second halide, for example iodide. As described in more detail below, the relative amounts of the two halides is important for successfully forming WBG perovskites having the preferred physical properties and performance properties previously described. In some embodiments of the present, y, for the molar amount of bromide present in the final perovskite may be between 0.2 and 0.8, inclusively, or between 0.25 and 0.50, inclusively. Therefore, to achieve this final target stoichiometry of X and X' in the final solid perovskite layer 142, the correct stoichiometry for X and X' must also be provided in the perovskite precursor solution. For example, for a target perovskite of $AB(I_{0.75}Br_{0.25})_3$, the amount of iodide and bromide provided in the precursor solution must be provided at a molar ration of I:Br of about 0.75 moles I to 0.25 moles of Br. So, in some embodiments of the present disclosure the ration of I:Br may be between 0.6:0.4 and 0.8:0.2. In some embodiments of the present disclosure, the perovskite precursors may be at molar concentrations between 0.5 to 2.5 M, or between 1.0 to 1.4 M, in the precursor solution.

Referring again to FIG. 1, once the perovskite precursor solution 112 is prepared, it is applied to the surface of a substrate 114 in an applying step 120, resulting in the forming of a liquid layer 122 on the surface of the substrate 114. In some embodiments of the present disclosure, the applying 120 may be achieved by spin coating, spray coating, dip coating, curtain coating, blade coating, and/or slot-die coating.

Once the liquid layer 122 of precursor solution 112 has been applied to the substrate 114, the liquid layer 122 (on the substrate 114) is directed to the gas contacting step 130. As described herein, the contacting 130 of the liquid layer 122 of bromine-containing perovskite precursor solution 112 with a gas 124 initiates the preferential crystallization of a bromine-rich perovskite layer, which eventually results in a final solid perovskite layer 142 having the benefits described herein. In some embodiments of the present disclosure, the liquid layer 122 is exposed to a stream of gas 124, which flows over the surface of the liquid layer 122, resulting in the mass transfer of solvent 104 from the liquid layer 122 to the gas 124, which then leaves the contacting step 130 in an exit gas 136. The solvent removal results in the perovskite crystallization. In some embodiments of the present disclosure, the gas 124 used in the contacting 130 may include at least one of an inert gas or air. Examples of inert gases include nitrogen, argon, and xenon. For the example of an air stream, the air may be substantially free of water. Gas mixtures may also be used. In some embodiments of the present disclosure, the gas 124 may be provided to the contacting step 130 at a temperature between 20° C. and 100° C., or between 20° C. and 30° C., or between 22° C. and 24° C. In some embodiments of the present disclosure, the gas 124 may be provided at a supply pressure between 20 psig and 70 psig, or between 30 psig and 40 psig.

In some embodiments of the present disclosure, at the start of the contacting 130, the liquid layer 122 may be provided at a temperature between 20° C. and 100° C., or between 20° C. and 30° C., between 22° C. and 24° C. For example, the perovskite precursor solution 112 may itself be heated prior to the applying 120 of the perovskite precursor solution 112 to the substrate 114. In some embodiments of the present disclosure, the substrate 114 may be heated before it is directed to the applying step 120, such that the liquid layer 122 is heated by the substrate 114 before both are directed to the gas contacting step 130. Among other things, higher temperatures of the gas 124, substrate 114, and/or liquid layer 122 may promote faster and/or more preferred mass transfer of solvent 104 from the liquid layer 122 into the gas 124. The time needed to obtain a solid perovskite layer will depend on a variety of factors, including the perovskite formulation, solvents used, process temperatures, etc. In some embodiments of the present disclosure, the contacting step 130 may be completed for a period of time between 1 second and 1 hour, or between 10 seconds and 100 seconds, or between 20 seconds and 30 seconds. In some embodiments of the present disclosure, applying 120 of the liquid layer 122 to the substrate 114 may be achieved using a slot-die coating method in a roll-to-roll (R2R) process, after which the gas contacting 130 may be achieved using an air knife.

Referring again to FIG. 1, in some embodiments of the present disclosure, a method 100 for manufacturing WBG perovskites may also include, after the contacting step 130, heating 140 the intermediate solid perovskite layer 132. Heating 140 may be done in order to remove any remaining solvent and/or to ensure that crystallization is complete, resulting in the final solid perovskite layer 142. In some embodiments of the present disclosure, the heating 140 may be performed by heating the intermediate solid perovskite layer to a temperature between 40° C. and 200° C., or between 80° C. and 150° C., or between 90° C. and 120° C. In some embodiments of the present disclosure, the heating 140 may be performed for a period of time between one second and one hour, or between 5 minutes and 15 minutes. In a R2R process, the heating may be completed after an air-knife contacting step 130 by passing the device stack, e.g., solid perovskite layer positioned on a substrate, through a heating zone. In some embodiments of the present disclosure this may be a enclosed furnace and/or oven that provides at least one of radiative, conductive, and/or convective heat transfer to the device stack.

Figure 2:
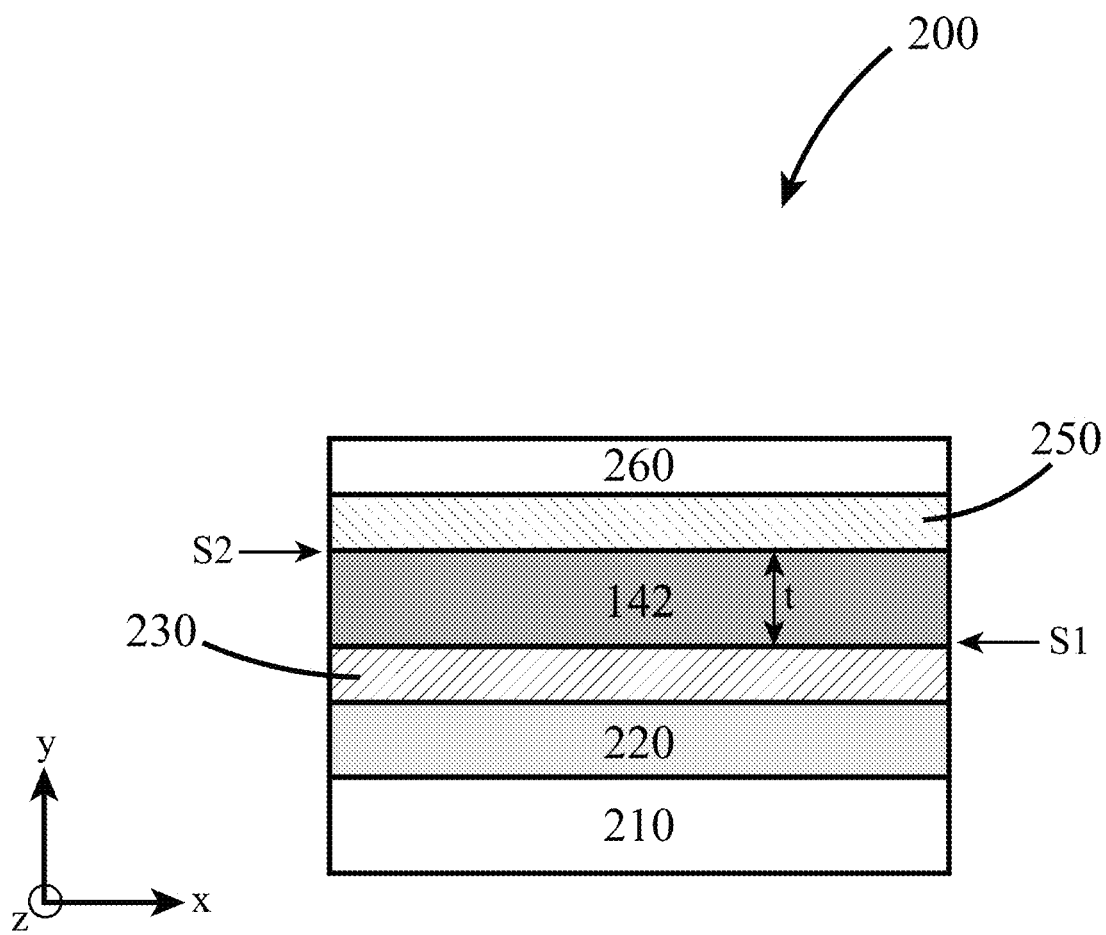
FIG. 2 illustrates a composition and/or device that includes, among other things, a WBG bromide-containing perovskite layer and a hole-transfer layer constructed of a self-assembling molecule (SAM), according to some embodiments of the present disclosure.

FIG. 2 illustrates a device 200, e.g., a solar cell, that includes a solid perovskite layer 142 like that produced in the method 100 illustrated in FIG. 1. As shown, a device 200 may include a perovskite layer 142 positioned between two charge transport layers, a hole-transfer layer (HTL) 230 and an electron-transfer layer (ETL) 250. To be a functional solar cell device, the device 200 may also include a first contact 220 and a second contact 260. As shown in FIG. 1, in this example, the HTL 230 is positioned between the first contact 220 and the perovskite layer 142 and the ETL 250 is positioned between the second contact 260 and the perovskite layer 142. In addition, the device 200 may include a substrate 210, where the first contact 220 is positioned between the substrate 210 and the HTL 230. Therefore, referring again to FIG. 1, the substrate 114 directed to the applying step 120 may be one or more layers, for example, the substrate 210 illustrated in FIG. 2, but also including a contact (e.g., first contact 220) and/or a charge transport layer (e.g., HTL 230), such that the perovskite precursor solution 112 is applied to a surface of the charge transport layer (e.g., HTL 230).

Referring again to FIG. 2, a perovskite layer 142 may have a first side (S1) and a second side (S2) defining a layer thickness (t) in the y-axis direction. Referring again to FIG. 1, as a result of the choice precursors included in the precursor stream 102, the perovskite layer may have a bulk composition as defined by $AB(X_{1-y}X_y')_3$, where A comprises a first cation, B comprises a second cation, X comprises a halide other than bromide, and X' comprises bromide. In some embodiments of the present disclosure, the halide (X) may include at least one of iodide or chloride, where y is between 0.2 and 0.8, inclusively, or between 0.25 and 0.50, inclusively. As a result of the contacting step 130, the perovskite layer 142 may have a bromide concentration gradient in the direction of the thickness (t), (in the y-axis direction), characterized by a maximum concentration at or in the proximity of the second side (S2) and a minimum concentration at the first side (S1). The presence of such a concentration gradient may be determined by testing the layer by transient absorption (TA) spectroscopy. In some embodiments of the present disclosure, the thickness (t) of the perovskite layer 142 may be between 100 nm and 1500 nm, or between 300 nm and 800 nm.

In some embodiments of the present disclosure, the first cation (A) making up the perovskite layer 142 may include at least one of methylammonium (MA), formamidinium (FA), dimethylammonium (DMA), guanidinium, cesium, and/or rubidium. In some embodiments of the present disclosure, the second cation (B) making up the perovskite layer 142 may include at least one of lead or tin. In some embodiments of the present disclosure, a perovskite layer 142 may have a composition as defined by $FA_{1-a-b}Cs_aDMA_bPb(I_{1-y}Br_y)_3$, where a may be between 0.01 and 0.7, 0.05 and 0.5, inclusively, and b may be between 0 and 0.2, inclusively, or between 0.1 and 0.2, inclusively. In some embodiments of the present disclosure, the perovskite may be characterized by a bandgap greater than about 1.5 eV, or between 1.57 eV and 2.1 eV, or between 1.65 eV and 1.85 eV.

As describe above, the method 100 illustrated in FIG. 1 and describe above may result in several identifying characteristics in the perovskite layer 142, including visual characteristics as measured by scanning electron microscopy (SEM) and structural as measured by X-ray diffraction (XRD). For example, the second side (S2) of the perovskite layer 142 may have no visible perovskite grain boundaries with a characteristic grain length between 100 nm and 1 µm, or between 100 nm and 500 nm when viewed by SEM. In addition, the perovskite layer 142 may show perovskite grains oriented substantially across the thickness (in the y-axis direction), as determined by transmission electron microscopy (TEM). In some embodiments of the present disclosure, a perovskite layer 142 may be identifiable by X-ray diffraction by the absence of peaks in at least one of a first range between 17 degrees 2θ and 26 degrees 2θ and/or a second range between 30 degrees 2θ and 33 degrees 2θ.

As described above, a device 200 may include an HTL 220. In some embodiments of the present disclosure, an HTL 220 may be constructed using a self-assembling monolayer (SAM), where the perovskite layer 142 and the SAM HTL 220 are positioned in parallel and in physical contact with each other. In some embodiments of the present disclosure, an HTL 220 may include a SAM constructed using at least one of 2-(3,6-Dimethoxy-9H-carbazol-9-yl)ethyl) phosphonic acid (MeO-2PACZ) and/or 4-(3,6-Dimethyl-9H-carbazol-9-yl)butyl)phosphonic acid (Me-4PACZ). In some embodiments of the present disclosure, an HTL 220 may include each of MeO-2PACZ and Me-4PACZ. In some embodiments of the present disclosure, an HTL 220 may include both of MeO-2PACz and the Me-4PACZ at a molar ratio between 1:2 and 20:1, or at a molar ratio between 1.2 and 8:1, or at a molar ratio between 1:1 and 2:1.

Referring again to FIG. 2, in some embodiment of the present disclosure, a substrate 210 may be constructed using at least one of a glass and/or a polymer. In some embodiments of the present disclosure a first contact 220 may be constructed of a transparent conducting oxide (TCO) such as indium-doped tin oxide (ITO), fluorine-doped tin oxide, indium zinc oxide, and/or cadmium stannate. In some embodiments of the present disclosure, an HTL 230 may include a self-assembling monolayer such as at least one of [2-(3,6-dimethoxy-9H-carbazol-9-yl)ethyl]phosphonic acid (MeO-2PACZ), ([4-(3,6-dimethyl-9H-carbazol-9-yl)butyl] phosphonic Acid) (Me-4PACZ), (4-(4-(3,6-dimethoxy-9H-carbazol-9yl)butyl)phosphonic acid (MeO-4PACZ), and/or ([2-(9H-carbazol-9-yl)ethyl]phosphonic acid (2PACZ). Other suitable materials for a HTL 230 that are non-self-assembling include poly[bis(4-phenyl)(2,4,6-trimethylphenyl)amine (PTAA), poly(N,N'-bis-4-butylphenyl-N,N'-bisphenyl)benzidine (Poly-TPD), and nickel oxide (NiO). In some embodiments of the present disclosure, an ETL 250 may include at least one of LiF, C60 fullerene, bathocuproine (BCP), and/or $SnO_2$. In some embodiments of the present disclosure, a second contact 260 may be constructed of at least one of gold, silver, molybdenum, copper, carbon, graphene, indium tin oxide (ITO), and/or indium zinc oxide (IZO).

Figure 3A:
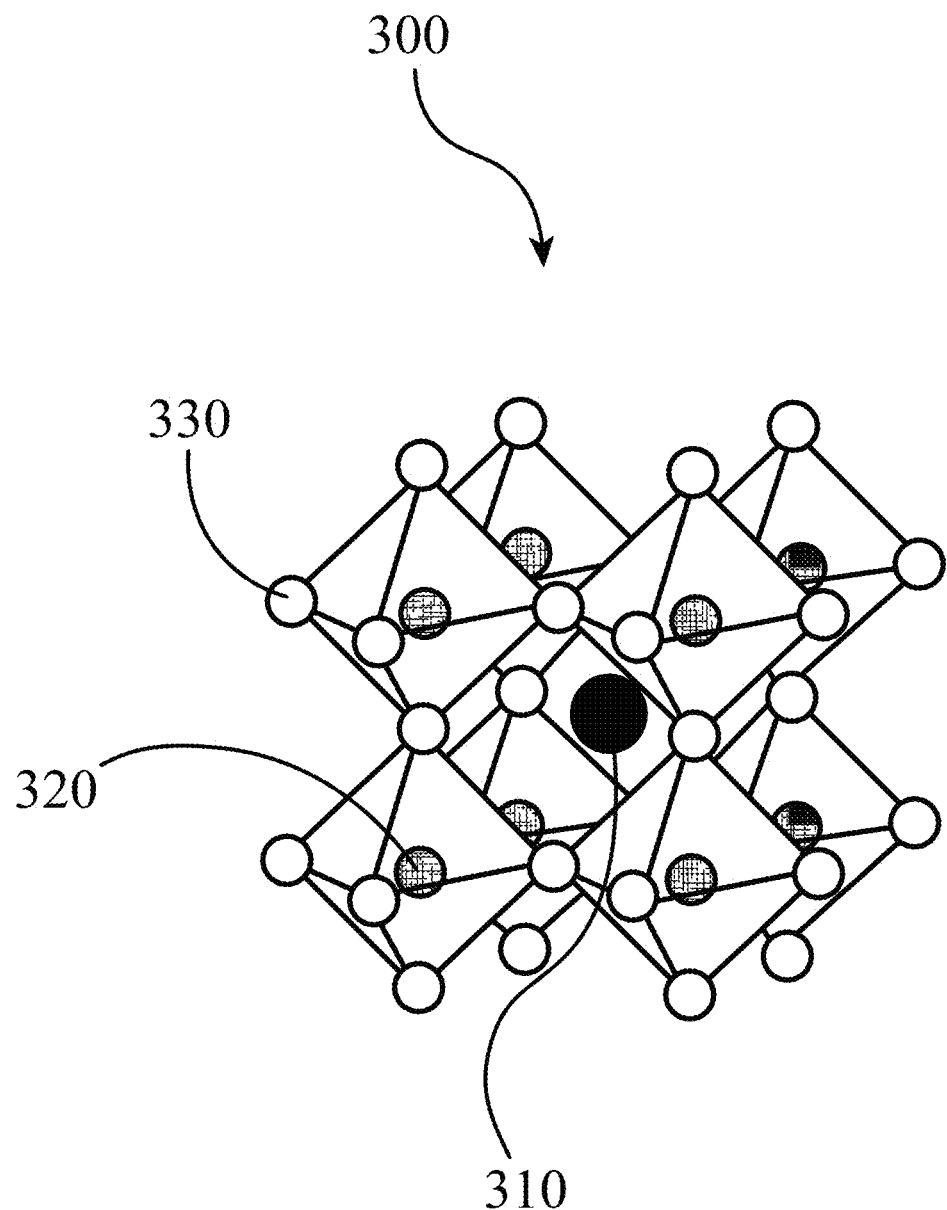
FIGS. 3A and 3B illustrate a perovskite in a corner-sharing, cubic phase arrangement, according to some embodiments of the present disclosure.
Figure 3B:
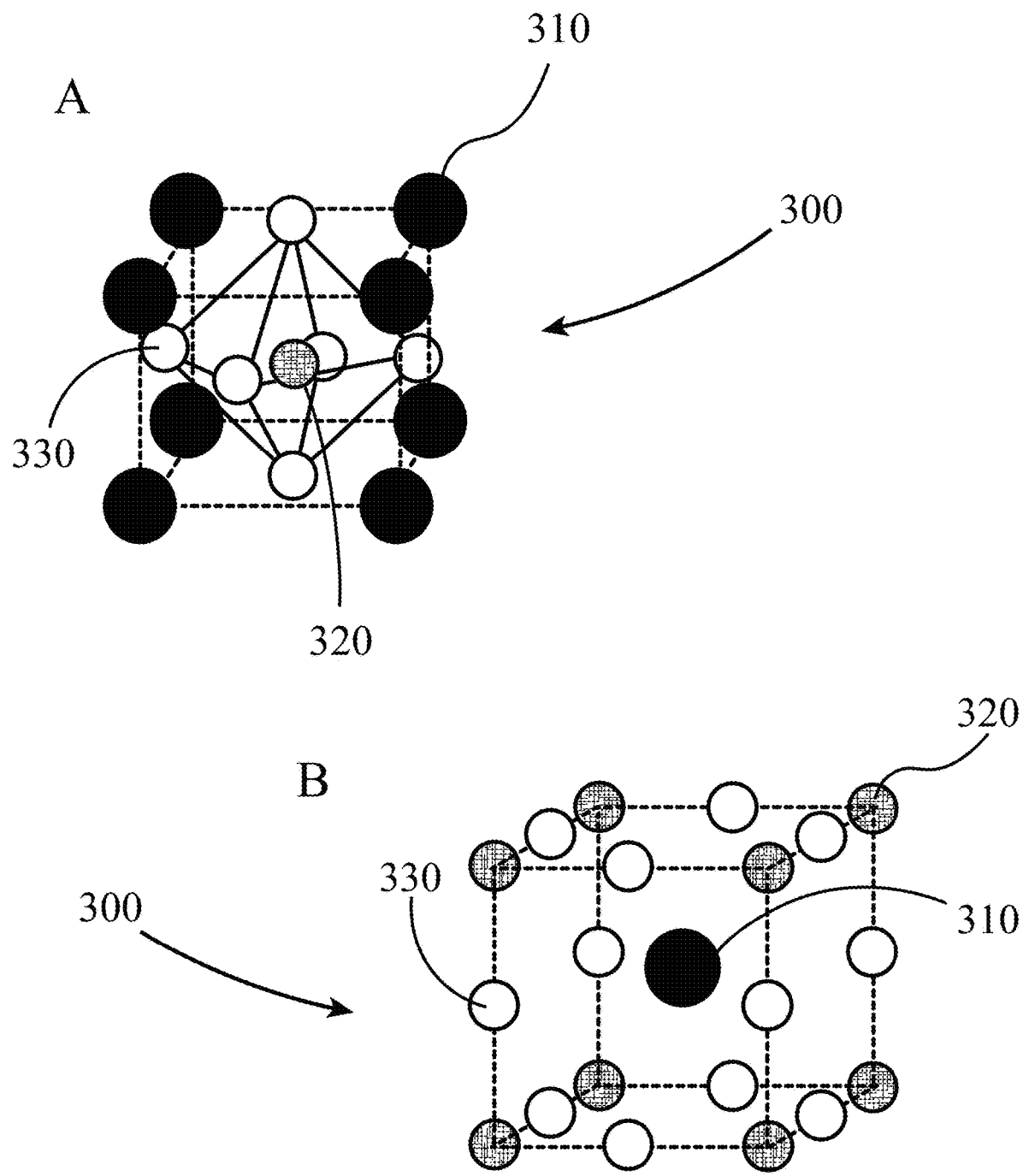

As briefly described above, the term "perovskite" refers to compositions having a network of corner-sharing $BX_6$ octahedra resulting in the general stoichiometry of $ABX_3$. FIGS. 3A and 3B illustrate that perovskites 100, for example metal halide perovskites, may organize into a three-dimensional (3D) cubic crystalline structures (i.e., a-phase or a-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 3A illustrates that a perovskite 100 having an a-phase structure may be further characterized by eight $BX_6$ octahedra surrounding a central A-cation 110, where each octahedra is formed by six X-anions 130 surrounding a central B-cation 120 and each of the octahedra are linked together by "corner-sharing" of anions, X (130).

Panel A of FIG. 3B provides another visualization of a perovskite 100 in the a-phase, also referred to as the cubic phase. This is because, as shown in FIG. 3B, a perovskite in the a-phase may be visualized as a cubic unit cell, where the B-cation 120 is positioned at the center of the cube, an A-cation 110 is positioned at each corner of the cube, and an X-anion 130 is face-centered on each face of the cube. Panel B of FIG. 3B provides another visualization of the cubic unit cell of an α-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIGS. 3B, the A-cations 110, the B-cations 120, and the X-anions 130 balance to the general formula $ABX_3$ of a perovskite, after accounting for the fractions of each atom shared with neighboring unit cells. For example, referring to Panel A of FIG. 3B, the single B-cation 120 atom is not shared with any of the neighboring unit cells. However, each of the six X-anions 130 is shared between two unit cells, and each of the eight A-cations 110 is shared between eight unit cells. So, for the unit cell shown in Panel A of FIG. 3B, the stoichiometry simplifies to B=1, A=8*0.125=1, and X=6*0.5=3, or $ABX_3$. Similarly, referring again to Panel B of FIG. 3B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to Panel B of FIG. 3B, the X-anions 130 and the B-cations 120 of a perovskite in the a-phase are aligned along an axis; e.g., where the angle at the X-anion 130 between two neighboring B-cations 120 is exactly 180 degrees, referred to herein as the tilt angle. However, as shown in FIG. 4A, a perovskite 100 may assume other corner-sharing crystalline phases having tilt angles not equal to 180 degrees.

Figure 4A:
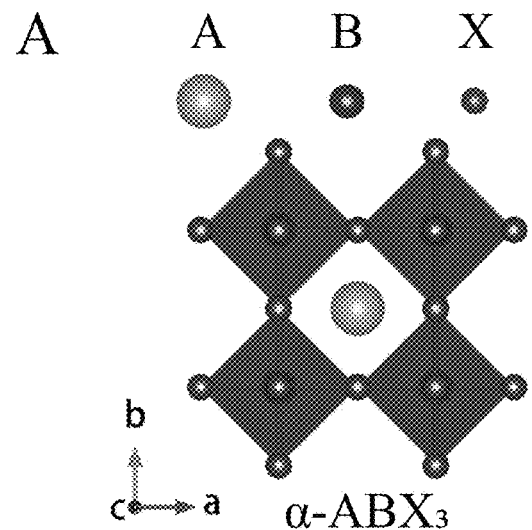
FIG. 4A illustrates three possible corner-sharing phases for perovskites, Panel A cubic phase (i.e., $\alpha$-$ABX_3$), Panel B a tetragonal crystalline phase (i.e., $\beta$-$ABX_3$), and Panel C an orthorhombic crystalline phase (i.e., $\gamma$-$ABX_3$), according to some embodiments of the present disclosure.
Figure 4A:
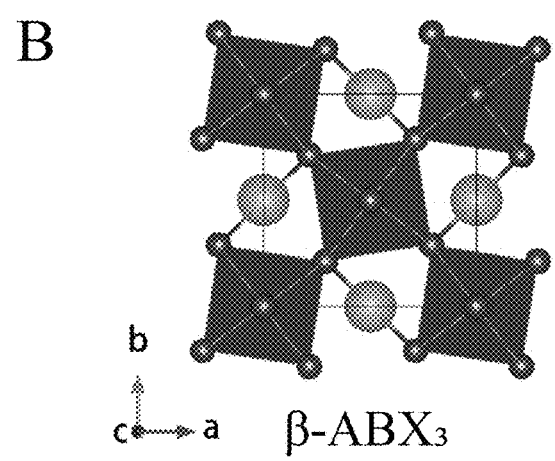
Figure 4A:
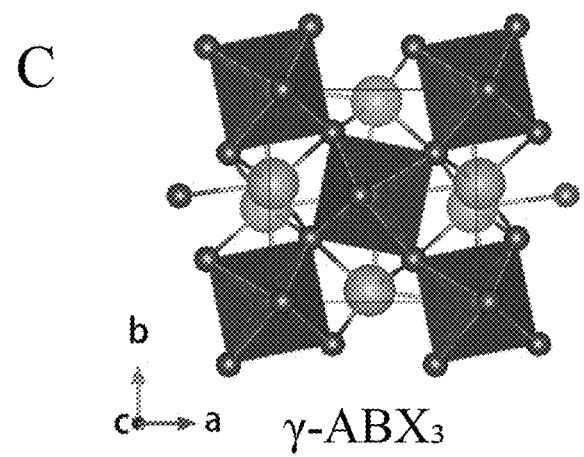

FIG. 4A illustrates that a perovskite can assume other crystalline forms while still maintaining the criteria of an $ABX_3$ stoichiometry with neighboring $BX_6$ octahedra maintaining X anion (130) corner-sharing. Thus, in addition to α-$ABX_3$ perovskites (in the cubic phase) having a tilt angle of 180 degrees, shown in Panel A of FIG. 4A, a perovskite may also assume a tetragonal crystalline phase (i.e., β-$ABX_3$) (see Panel B of FIG. 4A) and/or an orthorhombic crystalline phase (i.e., γ-$ABX_3$) (see Panel C of FIG. 4A), where the adjacent octahedra are tilted relative to the reference axes a, b, and c.

Figure 4B:
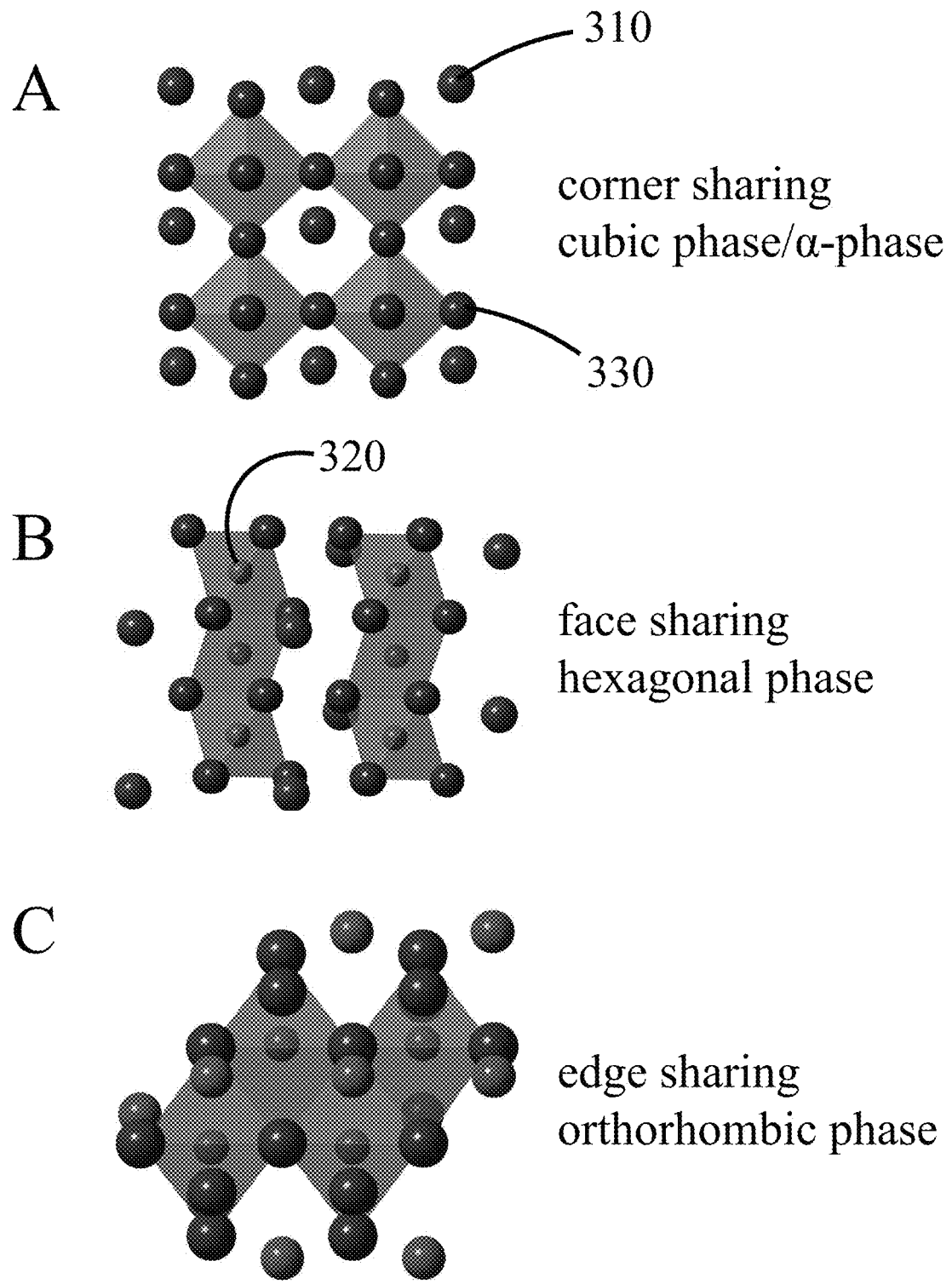
FIG. 4B illustrates a perovskite in one of the three possible phases, the cubic phase (i.e., $\alpha$-phase), compared to two non-perovskite phases (i.e., non-corner sharing), according to some embodiments of the present disclosure.

FIG. 4B illustrates that the elements used to construct a perovskite, as described above, A-cations 110, B-cations 120, and X-anions 130, may result in 3D non-perovskite structures; i.e., structures where neighboring $BX_6$ octahedra are not X-anion 130 corner-sharing and/or do not have a unit structure that simplifies to the $ABX_3$ stoichiometry. Referring to FIG. 4B, Panel A illustrates a perovskite in the cubic phase, i.e., α-$ABX_3$, compared to a non-perovskite structure constructed of face-sharing $BX_6$ octahedra resulting in a hexagonal crystalline structure (see Panel B of FIG. 4B) and a non-perovskite structure constructed of edge-sharing $BX_6$ octahedra resulting in an orthorhombic crystalline structure (see Panel C of FIG. 4B).

Figure 5:
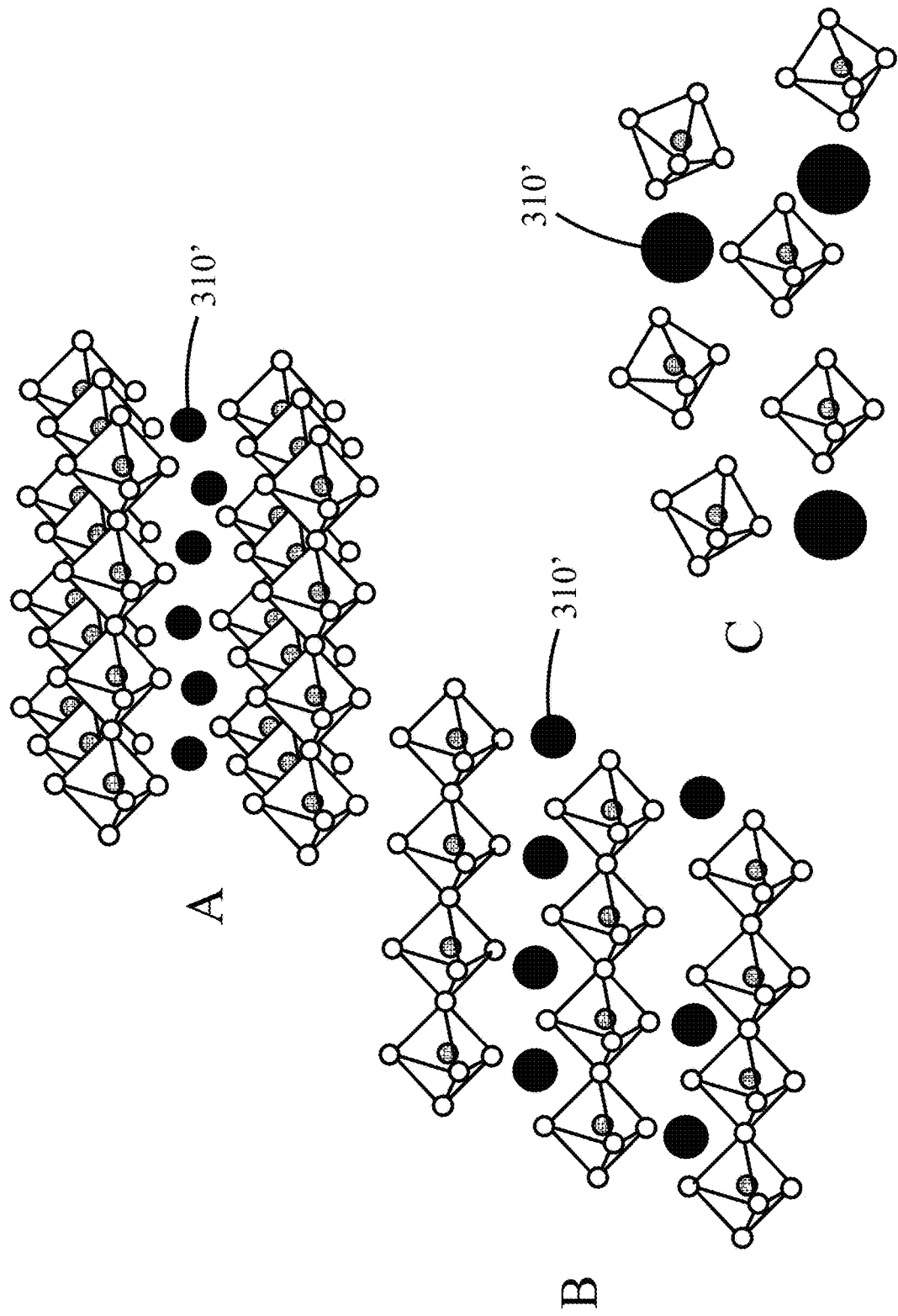
FIG. 5 illustrates 2D, 1D, and 0D perovskite-like structures, in Panels A, B, and C, respectively, according to some embodiments of the present disclosure.

Further, referring now to FIG. 5, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 5, such lower dimensional, perovskite-like structures still include the $BX_6$ octahedra, and depending on the dimensionality, e.g., 2D or 1D, may still maintain a degree of X-anion corner-sharing. However, as shown in FIG. 5, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 5, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}B_nX_{3n+1}$, where monovalent (m=2) or divalent (m=1) A' cations 110' can intercalate between the X-anions of 2D perovskite-like sheets. Referring to Panel B of FIG. 5, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 5, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material.

For simplification, as used herein the term "perovskite" will refer to each of the structures illustrated in FIGS. 3A through 5, unless specified otherwise. Thus, unless specified otherwise, the term "perovskite" as used herein includes each of a true corner-sharing $ABX_3$ perovskite, as illustrated in FIGS. 3A-3B and Panel A of FIG. 4A, as well as perovskite-like compositions having 0D, 1D, and/or 2D structures like those shown in FIG. 5, as well as non-perovskites as illustrated in Panels B and C of FIG. 4B.

In some embodiments of the present invention, the A-cation 110 may include a nitrogen-containing organic compound such as an alkyl ammonium compound. The B-cation 120 may include a metal and the X-anion 130 may include a halogen. Additional examples for the A-cation 110 include organic cations and/or inorganic cations, for example Cs, Rb, K, Na, Li, and/or Fr. Organic A-cations 110 may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations 110 include methylammonium ($CH_3NH_3^+$), ethylammonium ($CH_3CH_2NH_3^+$), propylammonium ($CH_3CH_2CH_2NH_3^+$), butylammonium ($CH_3CH_2CH_2CH_2NH_3^+$), formamidinium ($NH_2CH=NH_2^+$), hydrazinium, acetylammonium, dimethylammonium, imidazolium, guanidinium, benzylammonium, phenethylammonium, butylammonium and/or any other suitable nitrogen-containing or organic compound. In other examples, an A-cation 110 may include an alkylamine. Thus, an A-cation 110 may include an organic component with one or more amine groups. For example, an A-cation 110 may be an alkyl diamine halide such as formamidinium ($CH(NH_2)_2$). Thus, the A-cation 110 may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 3A and 3B, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations.

Figure 6:
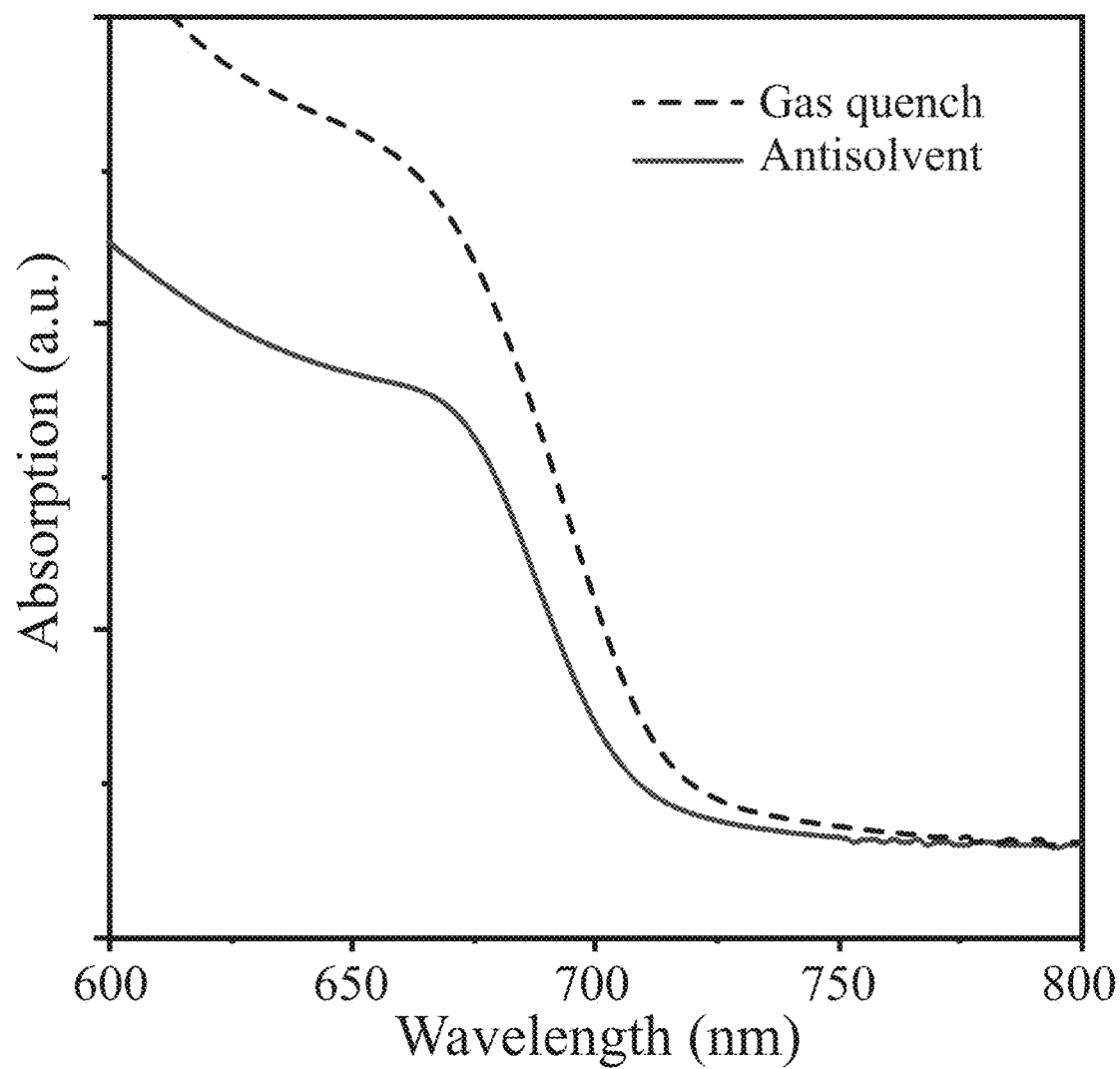
FIG. 6 illustrates ultraviolet-visible (UV-Vis) absorption spectra of wide-bandgap (WBG) perovskite thin films prepared by anti-solvent and gas-quench methods.

As described above, the present disclosure relates to a "gas-quench" method, i.e., a gas contacting step, for processing Br-containing perovskite precursor solutions to generate Br-containing solid perovskite layers that demonstrate excellent performance characteristics including a high power conversion efficiency (PCE), a high $V_{oc}$, and excellent operational device stability. One exemplary WBG perovskite formulation produced by this method, and shown herein, is $Cs_{0.3}FA_{0.6}DMA_{0.1}Pb(I_{0.7}Br_{0.3})_3$. However, this is just one example, and other WBG bromine-containing perovskite compositions are within the scope of the present disclosure. First, the "gas-quench" method was compared to the conventional antisolvent approach, commonly reported in literature, by ultraviolet-visible (UV-Vis) absorption spectra of the WBG perovskite layers prepared by both methods. Note that gas used in the gas contacting step of the method is $N_2$ gas for the studies reported herein unless otherwise stated. In comparison to the antisolvent sample, the gas-quench sample exhibited a slight redshift of the absorption onset, corresponding to a 10- to 20-meV decrease in bandgap (see FIG. 6). For these studies, an inverted (or p-i-n) device structure was utilized: glass/ITO/SAM/perovskite/LiF/$C_{60}$/bathocuproine (BCP)/Ag, where ITO is indium tin oxide and SAM denotes a self-assembled monolayer. The SAM HTL layer was a mixture of MeO-2PACz and Me-4PACz, where MeO-2PACz is (2-(3,6-Dimethoxy-9H-carbazol-9-yl)ethyl)phosphonic acid and Me-4PACz is (4-(3,6-Dimethyl-9H-carbazol-9-yl)butyl)phosphonic acid.

Figure 7:
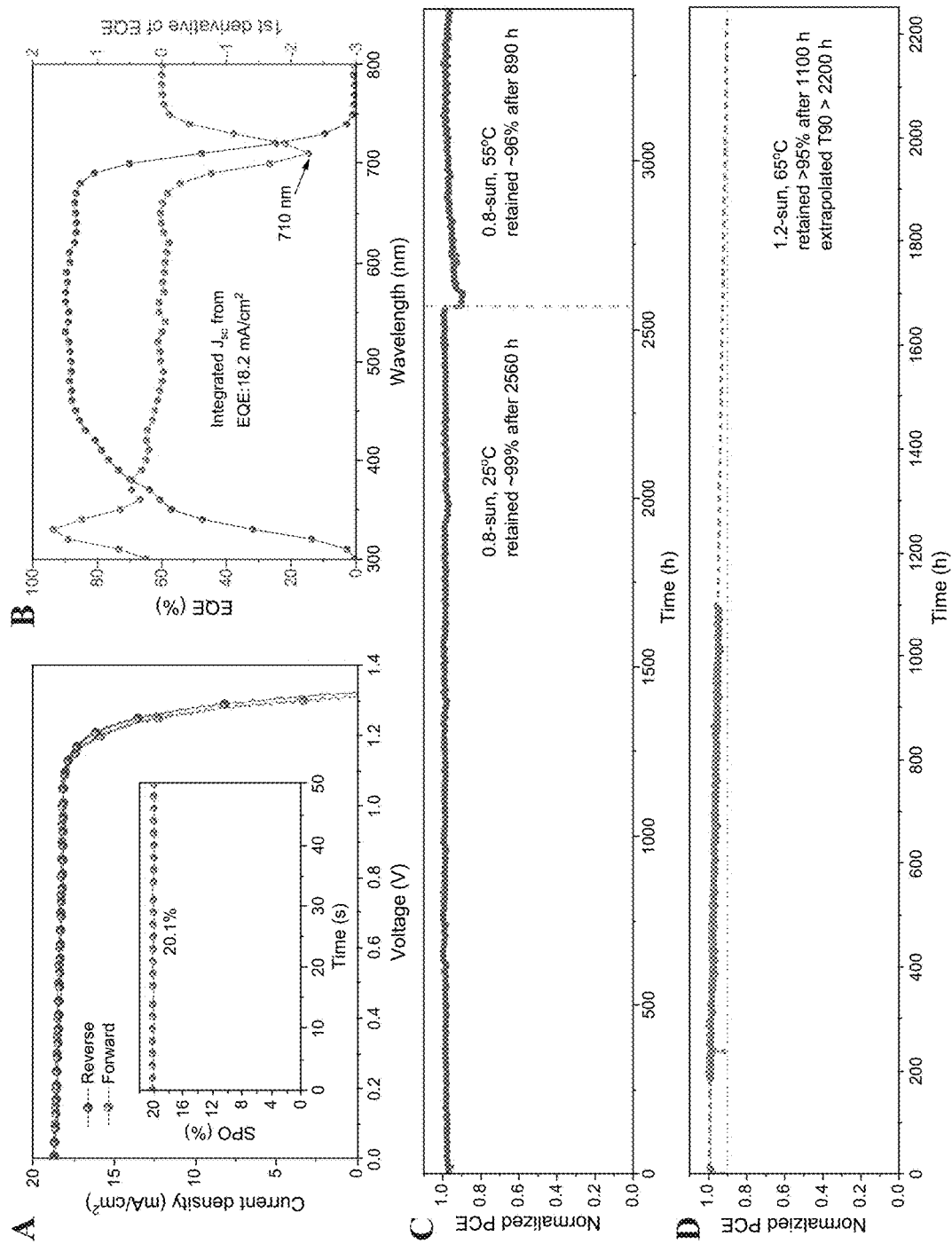
FIG. 7 illustrates device characteristics of 1.75-eV wide-bandgap (WBG) perovskite solar cells (PSCs) made by gas-quench processing. (A and B) Current density-voltage (J-V) curves of a WBG PSC under reverse and forward scans, with the inset showing the stable power output (SPO) efficiency (A), and the corresponding external quantum efficiency (EQE) with determination of the bandgap (B). (C and D) Long-term device operational stability under continuous light illumination in $N_2$ at different temperatures: a cell aged under 0.8-sun for 2560 hours at 25° C. followed by 890 hours at 55° C. (C), and a cell aged under 1.2-sun at 65° C. for 1100 hours with a linear extrapolation to estimate T90 (purple dashed line) (D).

The device characteristics of gas-quench-based WBG PSCs were examined (see FIG. 7). The current density-voltage (J-V) curves under reverse and forward voltage scans exhibited negligible hysteresis (see Panel A of FIG. 7), with reverse- and forward-scan PCEs of 20.3% and 20.0%, respectively; the detailed photovoltaic (PV) characteristics are tabulated in Table 1. The highest $V_o$ values reached ~1.33 V, and fill factor (FF) reached 85% (see FIG. 8). The stable power output (SPO) efficiency reached 20.1% (see Panel B of FIG. 7). The corresponding external quantum efficiency (EQE) spectrum (see Panel C of FIG. 7) yielded an integrated current density of 18.2 mA/cm$^2$, consistent with the J-V curves.

TABLE 1

Photovoltaic characteristics of gas-quench-based wide-bandgap perovskite solar cell with the corresponding J-V curves shown in Panel A of FIG. 7.

| Scan | $J_{sc}$ (mA cm$^{-2}$) | $V_{oc}$ (V) | FF (%) | PCE (%) |
|---|---|---|---|---|
| Reverse | 18.7 | 1.32 | 82.2 | 20.3 |
| Forward | 18.8 | 1.31 | 81.4 | 20.0 |

Figure 8:
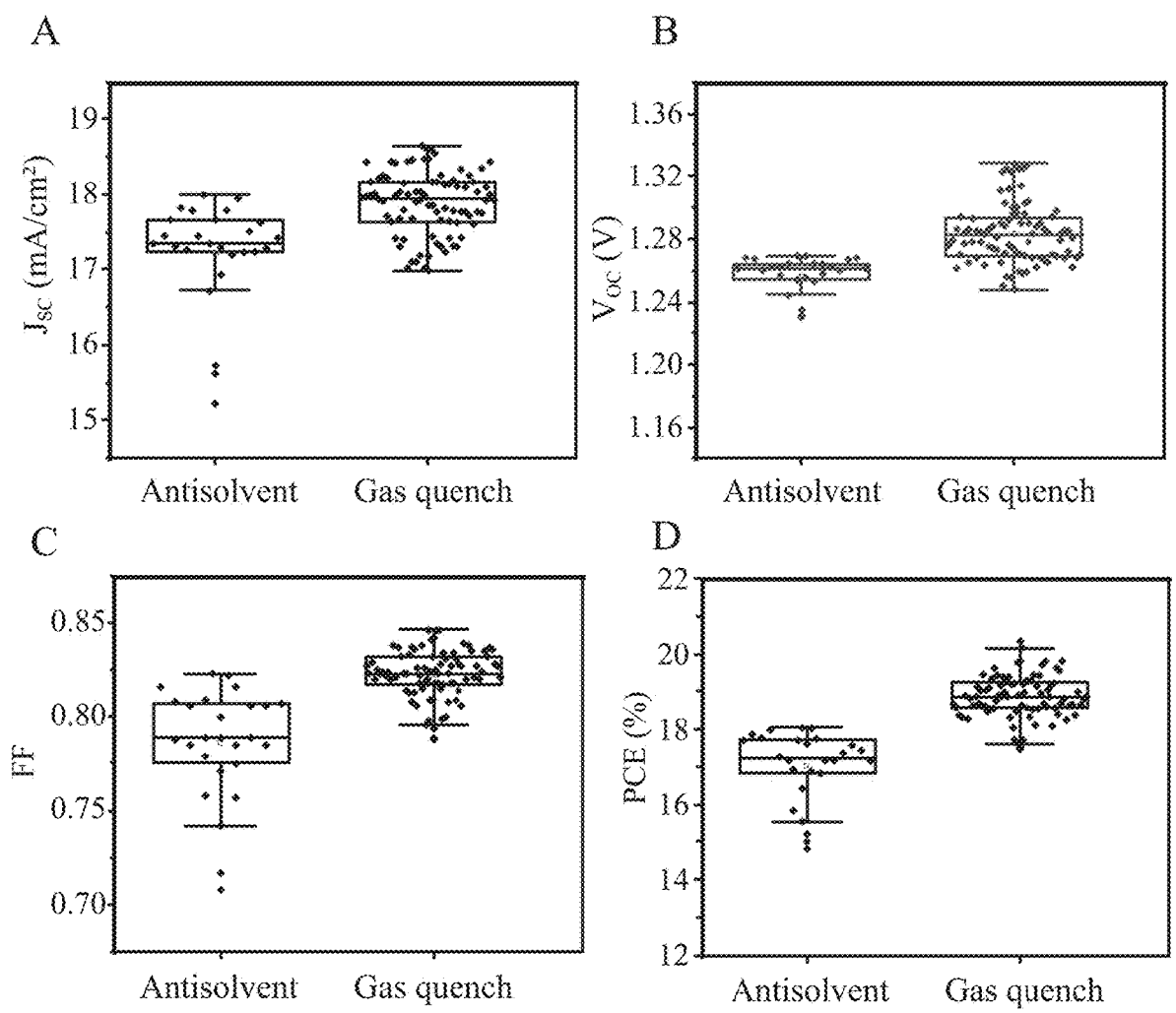
FIG. 8 illustrates a statistical comparison of photovoltaic (PV) parameters of WBG perovskite solar cells (PSCs) based on anti-solvent and gas-quench methods. The figure shows box charts containing the mean value, maximum/minimum values, and 25%-75%-region data of short-circuit current density ($J_{sc}$) (A), open-circuit voltage ($V_{oc}$) (B), fill factor (FF) (C), and power conversion efficiency (PCE) (D), collected from 26 anti-solvent devices and 86 gas-quench devices.
Figure 9:
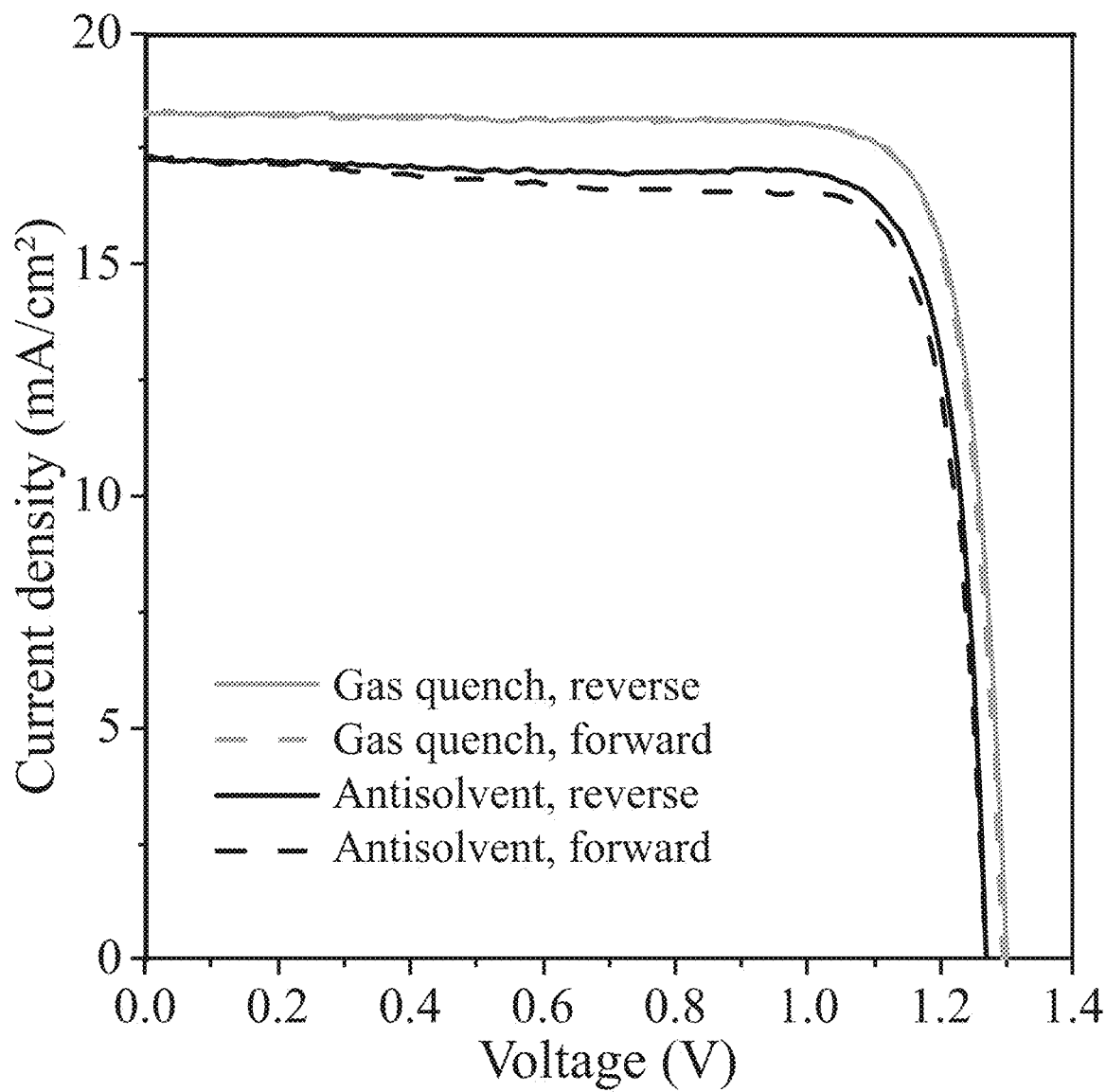
FIG. 9 illustrates a comparison of typical J-V curves of WBG PSCs based on perovskites made by anti-solvent and gas-quench methods.
Figure 10:
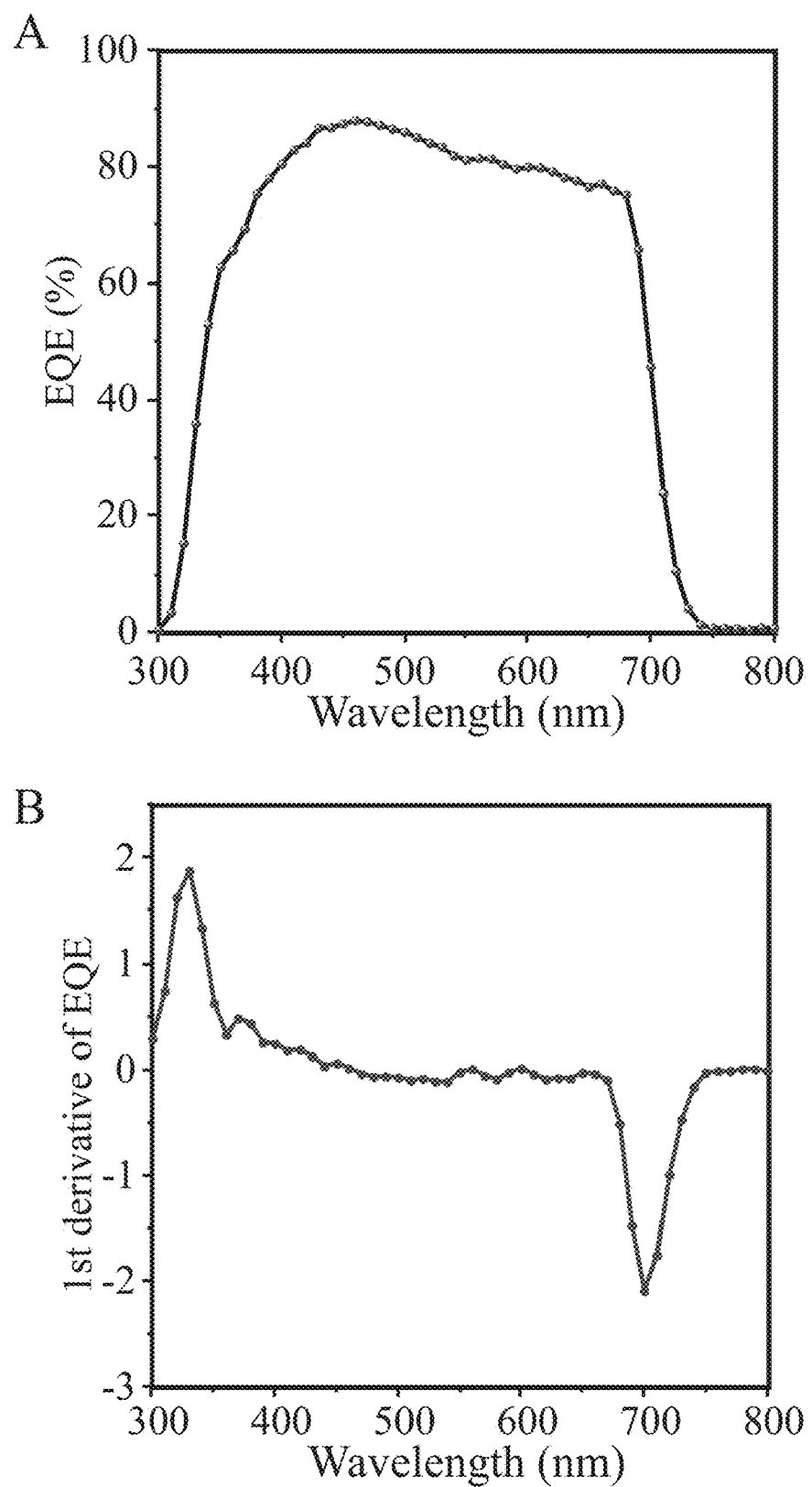
FIG. 10 illustrates the external quantum efficiency (EQE) and bandgap determination of WBG control device based on the anti-solvent method. (A) EQE spectra, and (B) plot of derivative of EQE spectra to determine the bandgap value.
Figure 11:
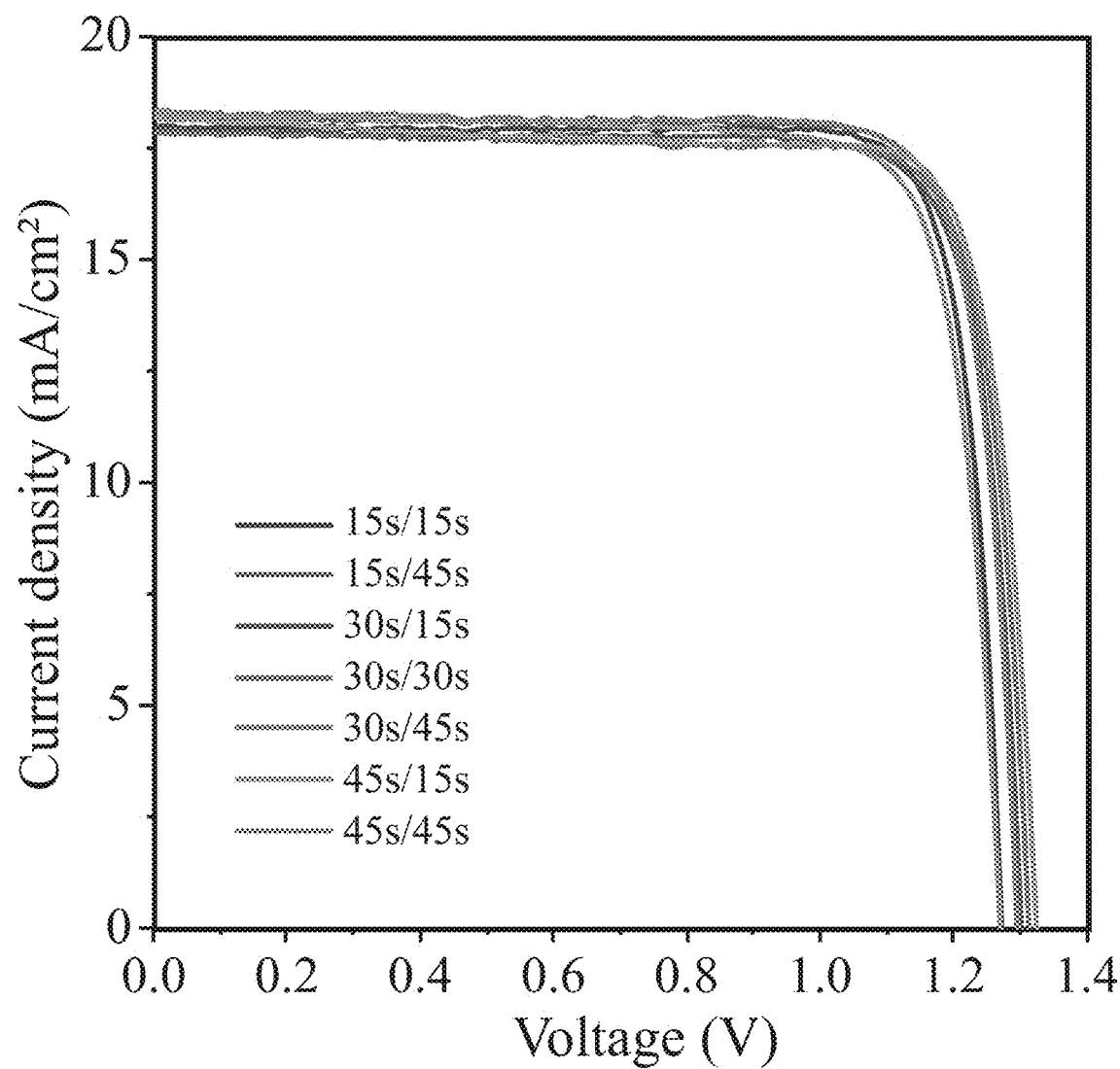
FIG. 11 illustrates a wide processing window with gas quench. J-V curves of WBG PSCs using perovskites made by an $N_2$ quench process under different conditions: spin-coating at 3000 r.p.m. for 15 s/30 s/45 s, followed by $N_2$ quench starting at 15 s/30 s/45 s for durations of 15 s/30 s/45 s. The resulting device performances are comparable, except for the 45 s/45 s sample, suggesting a wide processing window for the gas quench method to prepare WBG PSCs.
Figure 12:
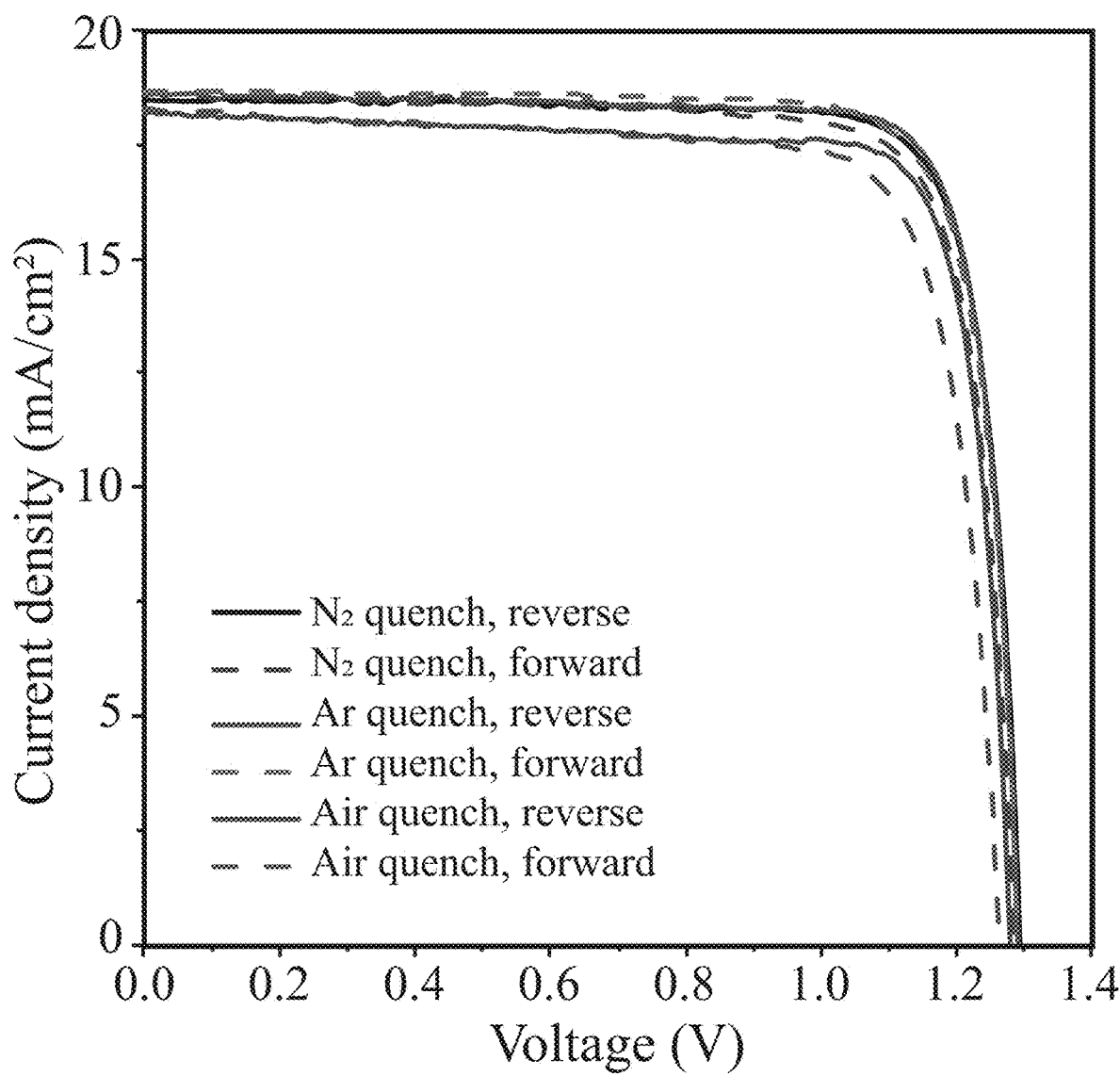
FIG. 12 illustrates a comparison of typical J-V curves of WBG PSCs based on perovskites made by quenching from a few different gases including $N_2$, Ar, and air.

Compared to the antisolvent method, the gas-quench-based WBG PSCs displayed enhancements in all PV parameters, especially in $V_{oc}$ (by ~30 mV) and short-circuit photocurrent density ($J_{sc}$) (by ~1 mA/cm$^2$), as shown in FIGS. 8 and 9. The enhanced $J_{sc}$ was partially attributed to the slightly reduced bandgap produced by the gas-quench method (see FIGS. 6 and 10). The gas-quench method was also statistically more reproducible than the antisolvent approach (see FIG. 8), which is consistent with the wider perovskite active layer processing window associated with the gas-quench approach (see FIG. 11). Note that was determined that the gas-quench method also resulted in similar quality perovskite layers when Ar or air was used as the gas in the contacting step, indicating that the gas-quench method is a general way for improving the performance of WBG PSCs (see FIG. 12).

Figure 13:
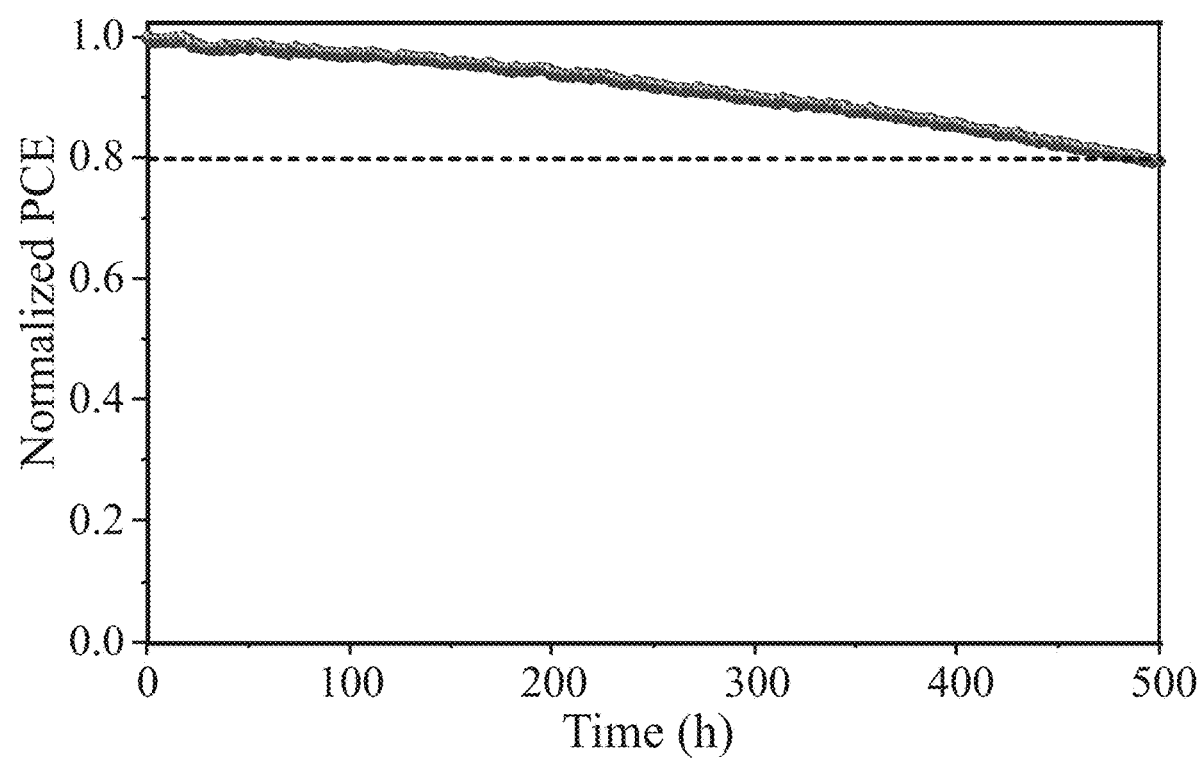
FIG. 13 illustrates the long-term stability of the control WBG PSC based on the anti-solvent method. The device was aged under 0.8-sun at 25° C.

In addition to the PCE enhancement, the gas-quench method led to excellent operational stability from 25° to 65° C. The gas-quench-based WBG PSC exhibited minimal changes in device efficiency, retaining ~99% of the maximum PCE under continuous 0.8-sun light-soaking from a sulfur plasma lamp near the maximum power point (MPP) at ~25° C. over 2560 hours in an $N_2$ atmosphere (see Panel D of FIG. 7). In contrast, the antisolvent-based control device showed a dramatic PCE drop when tested under the same operation condition (see FIG. 13). For the same gas-quench-based device, the stability was tested at 55° C. (see second half of Panel D of FIG. 7, separated by a vertical dashed line). The same cell retained about 96% of its maximum PCE during aging under 0.8-sun illumination at 55° C. over 890 hours.

A separate device manufactured using the gas-quench method was tested under 1.2-sun light-soaking illuminated by white light emitting diodes near MPP at 65° C. in $N_2$ (see Panel E of FIG. 7). This device retained >95% of its maximum PCE over 1100 hours of aging, with a linear extrapolation to a T90 >2200 hours (T90 means the time for a solar cell to degrade to 90% of its maximum efficiency).

Figure 14:
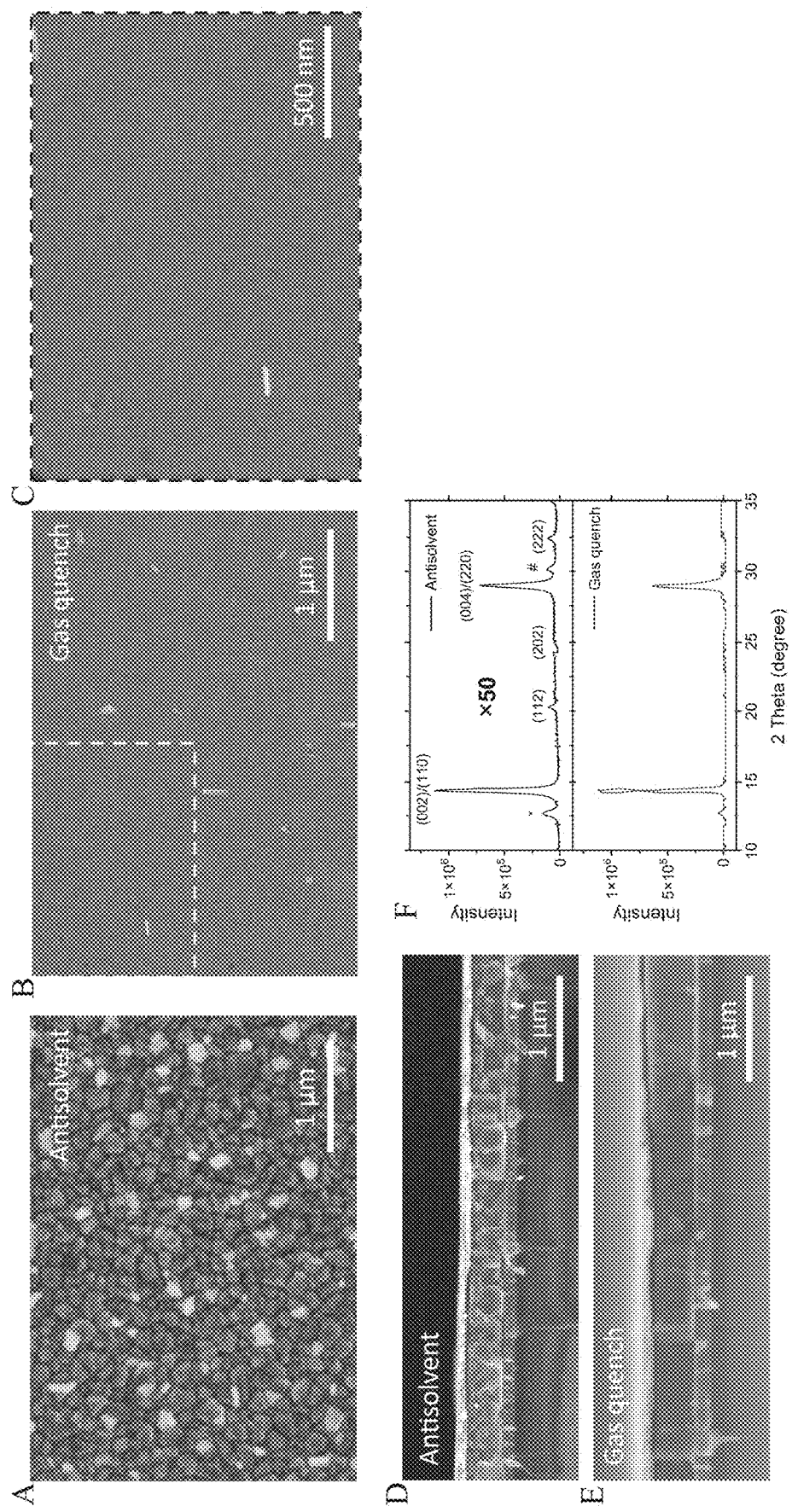
FIG. 14 illustrates structural properties of WBG perovskite. (A-C) Top-view scanning electron microscopy (SEM) images of $FA_{0.6}Cs_{0.3}DMA_{0.1}Pb(I_{0.7}Br_{0.3})_3$ perovskite thin films made by anti-solvent (A) and gas-quench (B and C) methods. (C) shows the magnified image of the selected region in (B). (D-E) Cross-section SEM images of WBG perovskite films made by antisolvent (D) and gas-quench (E) methods. (F) X-ray diffraction (XRD) patterns of WBG perovskite films made by anti-solvent and gas-quench methods. The peak labeled with * denotes $PbI_2$, and the peak labeled with # denotes ITO.

When using the gas quench method, the resultant structure and morphology data indicated that the perovskite nucleation and grain growth dynamics were distinct from what occurs during the antisolvent approach. The gas-quench film exhibited dense, closely packed morphology with a flat, smooth surface and nearly invisible grain boundaries (see Panels B and D of FIG. 14). The morphology difference between the two methods was also evident in the corresponding cross-section SEM images (see Panels D and E of FIG. 14).

Figure 15:
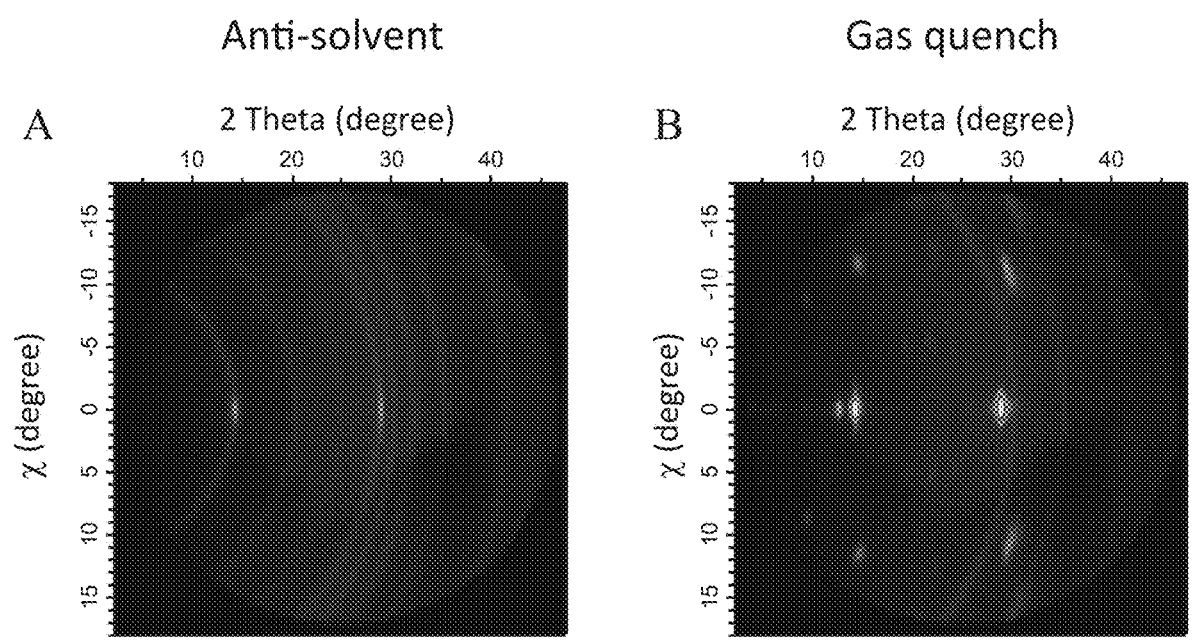
FIG. 15 illustrates 2D XRD measurements of perovskite films based on (A) the anti-solvent method and (B) the gas-quench method.
Figure 16:
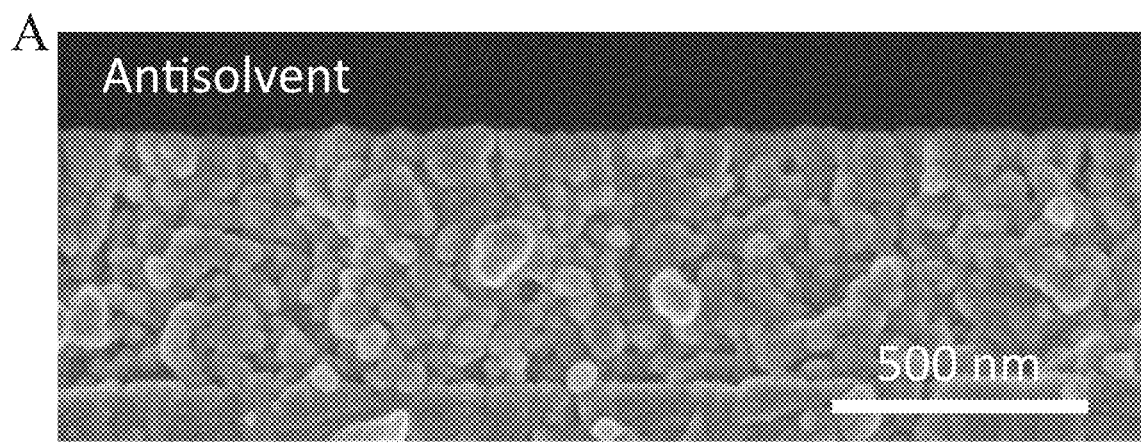
FIG. 16 illustrates a scanning electron microscopy (SEM) comparison of WBG perovskite thin films prepared via anti-solvent and gas quench using a higher concentration of precursor solution. A higher concentration results in faster crystallization and thus a stronger contrast of the perovskite film morphology prepared via the anti-solvent and gas-quench methods. This further supports the value of gas quench to prepare high-Br-content WBG perovskite thin films.
Figure 16:
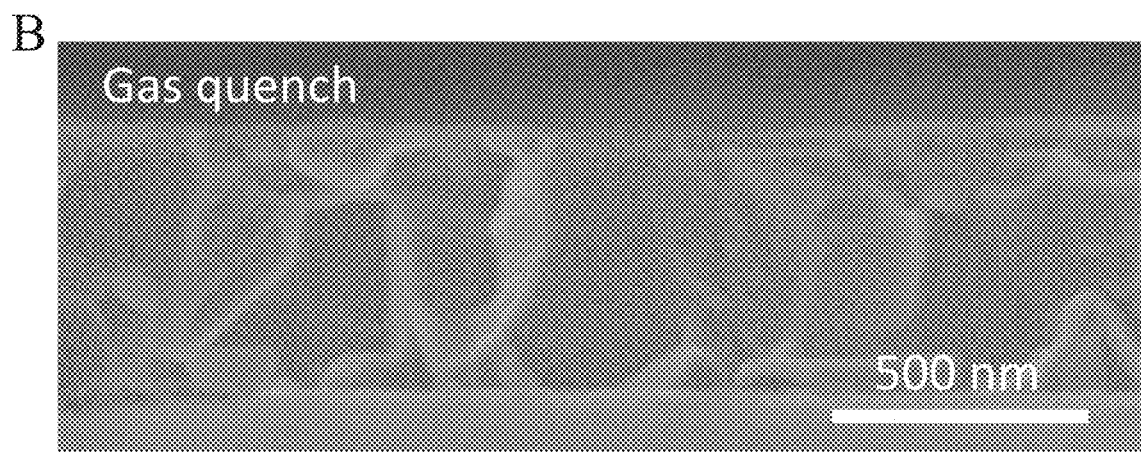
Figure 17:
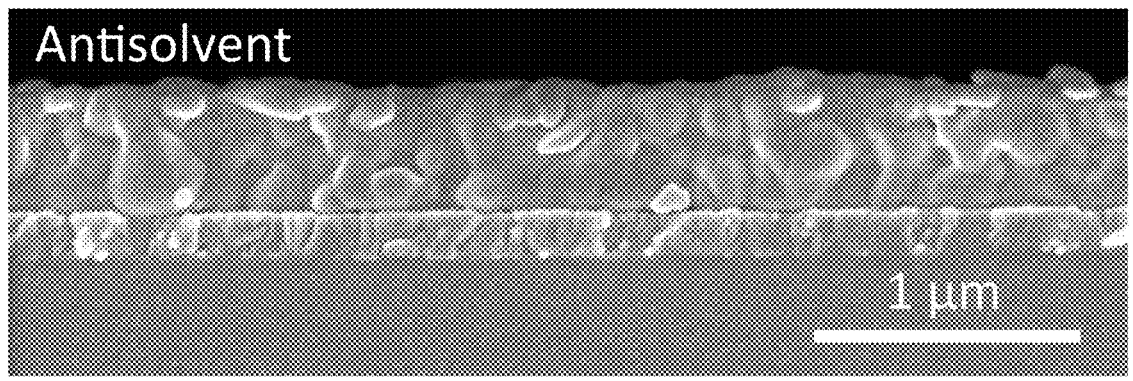
FIG. 17 illustrates a SEM comparison of perovskite thin films prepared via anti-solvent and gas quench using pure-iodide $Cs_{0.3}DMA_{0.1}FA_{0.6}PbI_3$ perovskite precursor solution. In the absence of Br, the morphology difference between the two methods is reduced, which supports the value of combining the gas-quench method with high-Br-content perovskite precursor to prepare high-quality WBG perovskite films.
Figure 17:
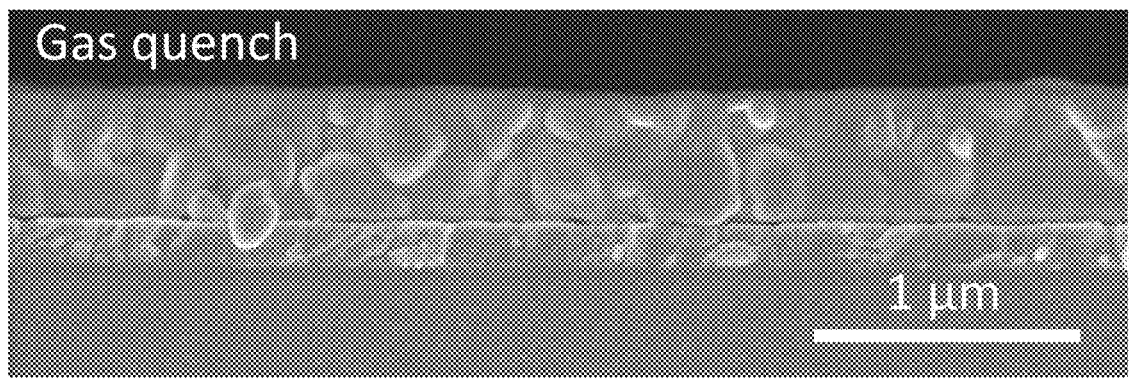

Gas quenching also led to an enhanced (by 50×) main x-ray diffraction (XRD) diffraction peak (2θ=14.2°) and a reduced full-width-half-maximum (FWHM) (from 0.29° to 0.17°) (see Panel F of FIG. 14), suggesting enhanced ordering in the perovskite film. The gas-quench sample exhibited much stronger texturing (see FIG. 15). The textured columnar grains suggest that the vertical GBs are mostly low-angle GBs. The morphology contrast was more pronounced for higher concentrations of the Br-rich perovskite precursor (see FIG. 16). In contrast, when a pure I-based perovskite precursor was used, the morphology difference was substantially reduced, with both gas-quench and antisolvent samples showing multiple apparent grains across the film thickness (see FIG. 17). These results support the rationale for coupling the gas-quench process with a high-Br-content precursor for generating highly textured, top-down columnar growth of WBG perovskite films.

Figure 18:
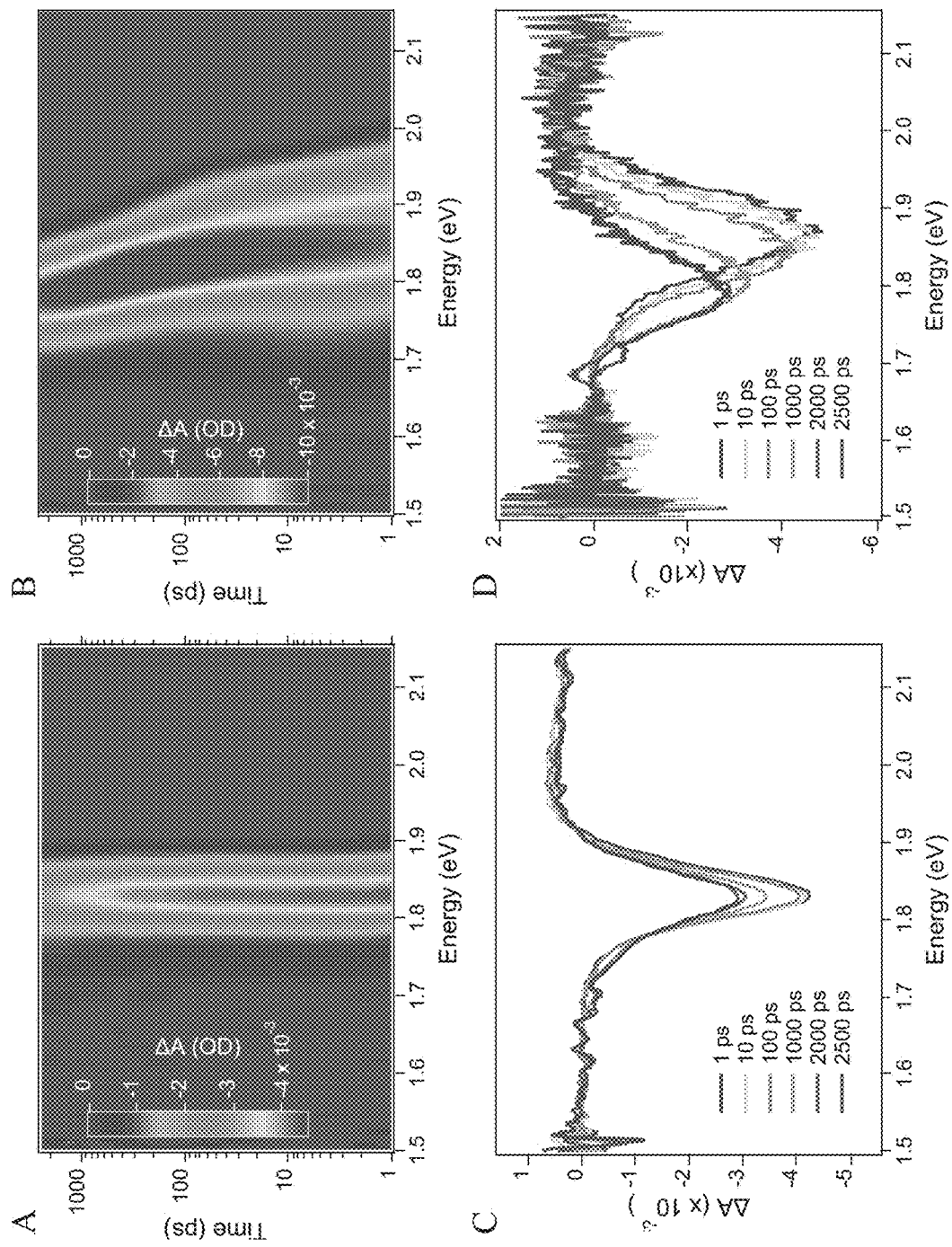
FIG. 18 illustrates transient absorption (TA) measurements. Pseudocolor representation of the TA results (A and B) and the TA spectra at various post-pump delay times (C and D) of WBG perovskite thin films prepared by anti-solvent (A and C) and gas-quench (B and D) methods. The pump excitation energy is 3.1 eV (400 nm) incident from the top of the perovskite samples.

As shown by transient absorption (TA) measurements the antisolvent method yielded perovskite films having a relatively uniform distribution of the perovskite composition along the vertical direction (i.e., y-axis direction, changing with thickness. In contrast, the gas-quench resulted in more Br-rich nucleation at the surface layer (at the S2 surface in FIG. 2), followed by a gradient structure along the vertical direction (y-axis direction), resulting in columnar growth. Transient absorption (TA) measurements of the antisolvent sample showed a single ground-state bleach peak during the carrier's lifetime indicating a uniform composition within the sample as carriers diffuse across the film and sample the energetic landscape prior to relaxing back to their ground state (see Panels A and C of FIG. 18).

Figure 19:
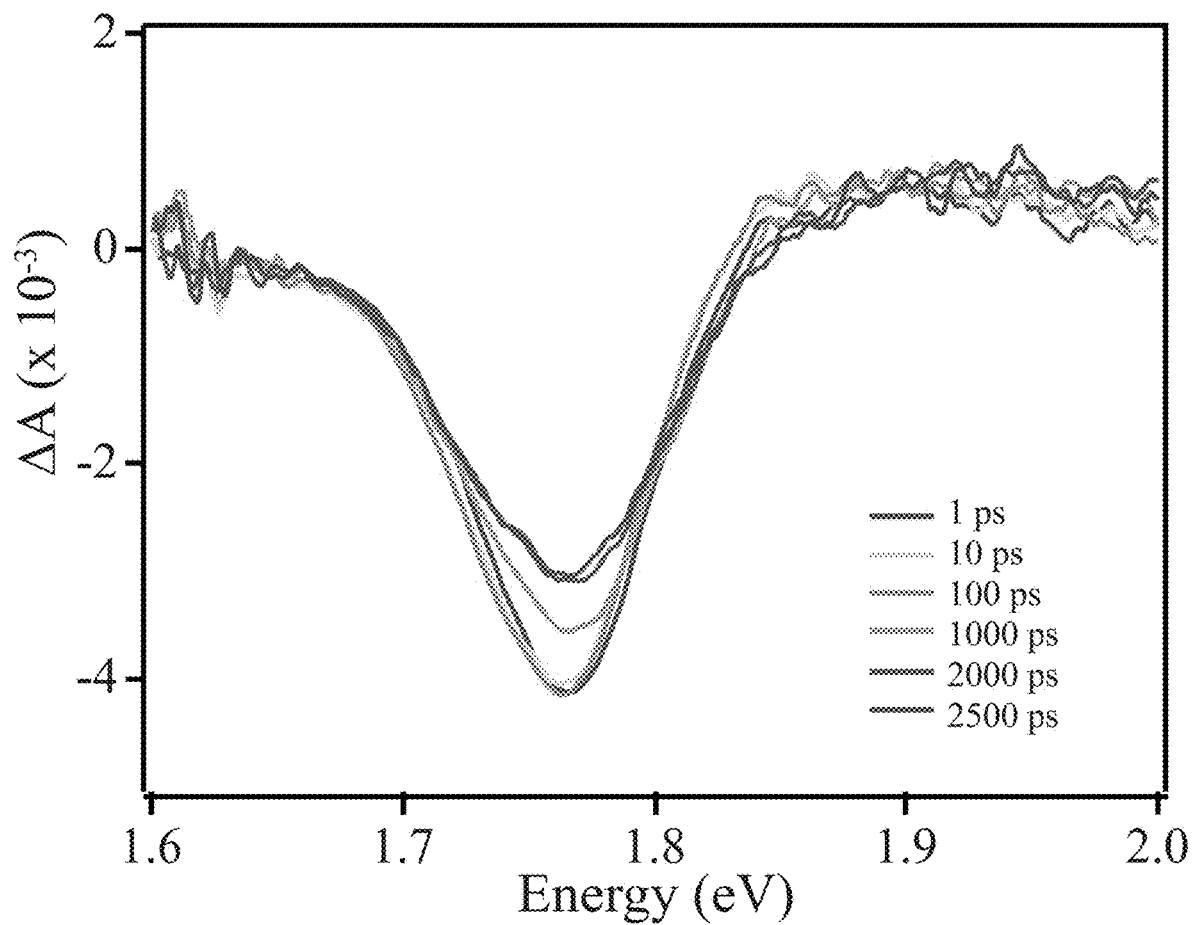
FIG. 19 illustrates a transient absorption spectrum over time for gas-quench sample excited from the back (glass) side at 3.1-eV excitation. The single ground state bleach seen in the back excitation is in direct contrast to the shifting ground state bleach from the front excitation.
Figure 20:
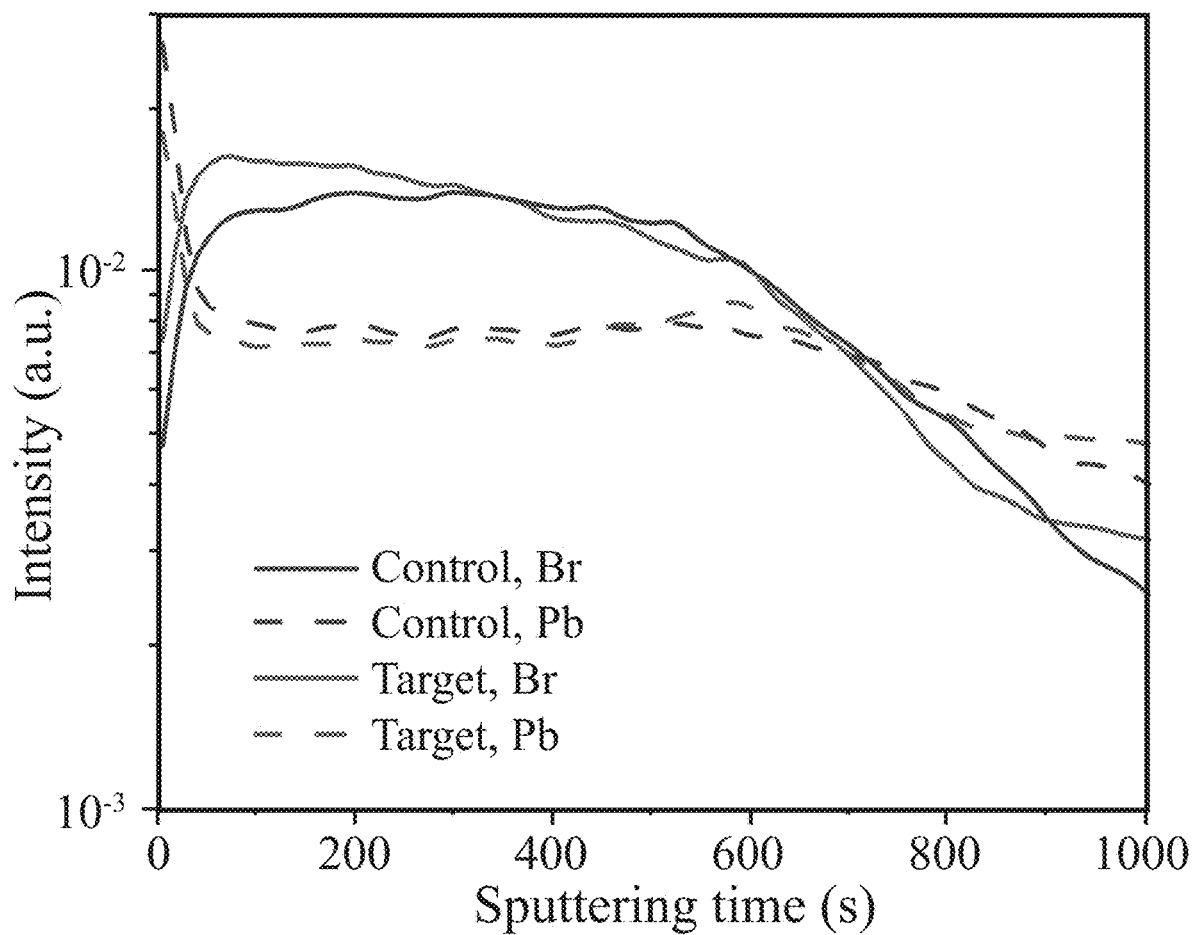
FIG. 20 illustrates a comparison of TOF-SIMS depth profiles of WBG perovskite thin films prepared by anti-solvent (control) and gas-quench (target) methods. Note that as always, one should not closely interpret the first few data points in SIMS depth profiling, as surface contaminants drastically alter the SIMS ionization probability and cause large apparent changes in signal measured until the sputtered sample is reached after a few data acquisition and sputter cycles.

The gas-quench sample showed a distinct shifting of the ground-state bleach as a function of time after excitation. At early times, the bleach occurred at a higher energy corresponding to carriers residing in a Br-rich (higher energy) region and then the bleach slowly shifted to a lower energy, corresponding to carriers moving toward the region with reduced Br content. The ground state bleach shifted by ~0.1 eV, over a time scale of hundreds of picoseconds (see Panels B and D of FIG. 18, B and D). When the gas-quench sample was excited from the back side, no evolution of the TA spectrum was observed (see FIG. 19). Thus, the evolution in the TA spectrum for the gas-quench sample indicates that there is a gradient in the Br-content, where the higher bandgap (more Br) lies at the surface of the film and the lower bandgap (less Br) is deeper into the film. The gradient structure is consistent with the time-of-flight secondary-ion mass spectroscopy results (see FIG. 20). At the early pump-probe times, only the high-bandgap, Br-rich perovskite at the surface of the film was excited because of Beer's law absorbance of the pump pulse into the film-surface, and the TA spectrum showed its spectral signature. After hundreds of picoseconds, the photoexcited charge carriers that initially resided near the top surface diffused into the perovskite film, and thus the TA-spectrum evolved to the spectral signature of the lower-bandgap, more I-rich perovskite. Such a gradient composition may create an energy cascade structure that can be beneficial for solar cell operation as it repels carriers away from defective surfaces.

Figure 21:
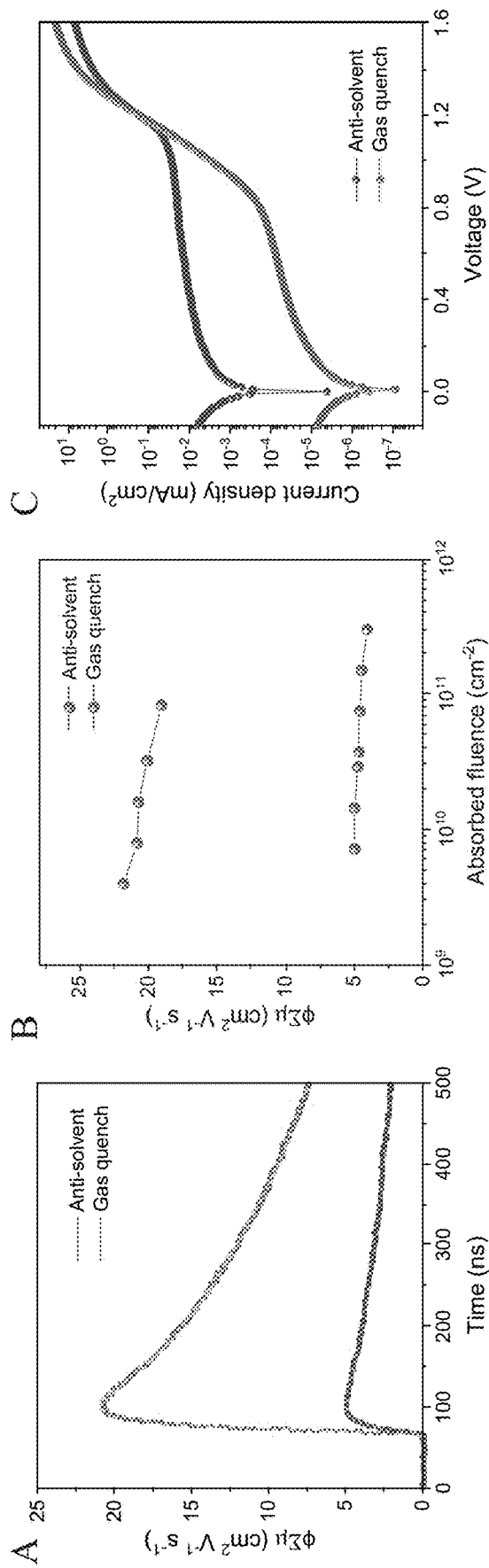
FIG. 21 illustrates optoelectronic properties and calculation of defect-assisted diffusion barriers. (A) Photoconductivity ($\phi\Sigma\mu$) transients for the lowest absorbed pump fluence, obtained via time-resolved microwave conductivity (TRMC) measurement. Pulsed (10-Hz) optical excitation at 1.93 eV (643 nm) was used, with an absorbed fluence range over about two orders of magnitude. (B) Excitation intensity dependence of photoconductivity as a function of excitation intensity. (C) Dark J-V curves for PSCs based on perovskite films prepared with antisolvent and gas-quench methods.

Time-resolved microwave conductivity (TRMC) and dark J-V measurements were conducted to examine the impact of growth methods on optoelectronic properties. Analysis of typical TRMC transients revealed that the yield-mobility product $\phi\Sigma\mu$ value (where $\phi$ is free-carrier generation yield and $\Sigma\mu$ is the sum of carrier mobilities of holes and electrons) and free carrier lifetime were 4.9 cm$^2$ V$^{-1}$ s$^{-1}$ and 426 ns for antisolvent samples but 20.8 cm$^2$ V$^{-1}$ s$^{-1}$ and 355 ns for gas-quench samples, respectively (see Panel A of FIG. 21). The relative change in $\phi\Sigma\mu$ is observed over a wide range of excitation intensities (see Panel B of FIG. 21). The carrier diffusion lengths, determined by the product of carrier mobility and lifetime, were 2.3 μm for the antisolvent sample and 4.4 μm for the gas-quench sample.

Figure 22:
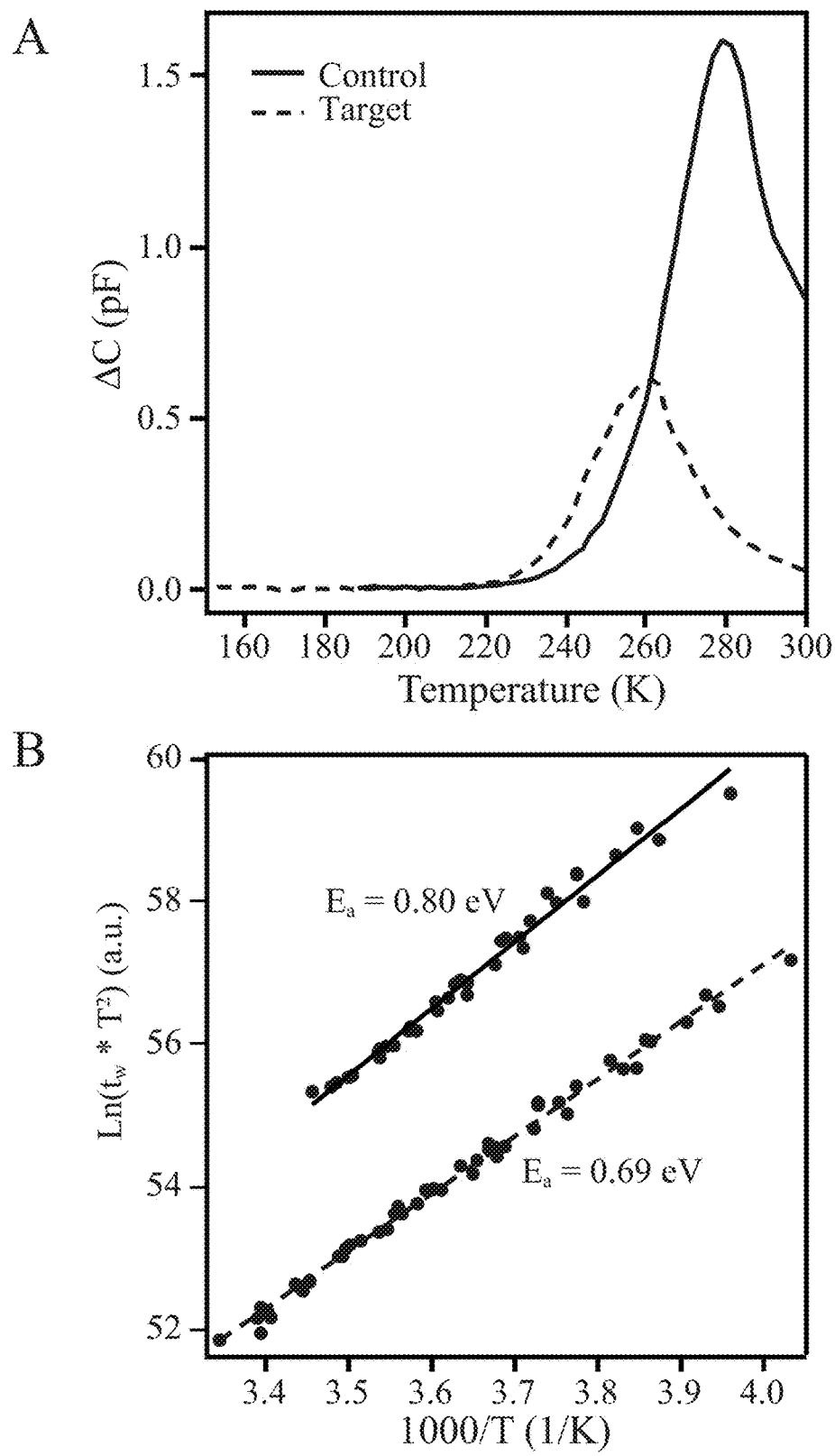
FIG. 22 illustrates deep-level transient spectroscopy (DLTS) measurements of wide-bandgap perovskite solar cells based on perovskite films prepared by anti-solvent (control) and gas-quench (target) methods. (A) Typical DLTS spectra of the control and target samples measured with a time window ($t_W$) of 50 ms and temperature range of ~150-300 K. (B) Arrhenius analysis of the DLTS results of the control and target samples.

The suppressed gigahertz mobility value for the antisolvent sample was consistent with greater structural disorder indicated in the XRD data and the morphology and apparent-grain nonuniformities observed in the SEM images. For the gas-quench sample, the longer carrier diffusion length, which is often associated with enhanced material quality (degree of crystallinity) and reduced defect density, was consistent with the improved device characteristics. The comparison of the dark J-V curves (see Panel C of FIG. 21) showed a greater than two-orders of magnitude increase in shunt resistance that reduced leakage current and was suggestive of a lower defect density for gas-quench-based PSCs (52), which is consistent with the deep level transient spectroscopy (DLTS) results (see FIG. 22).

Figure 23:
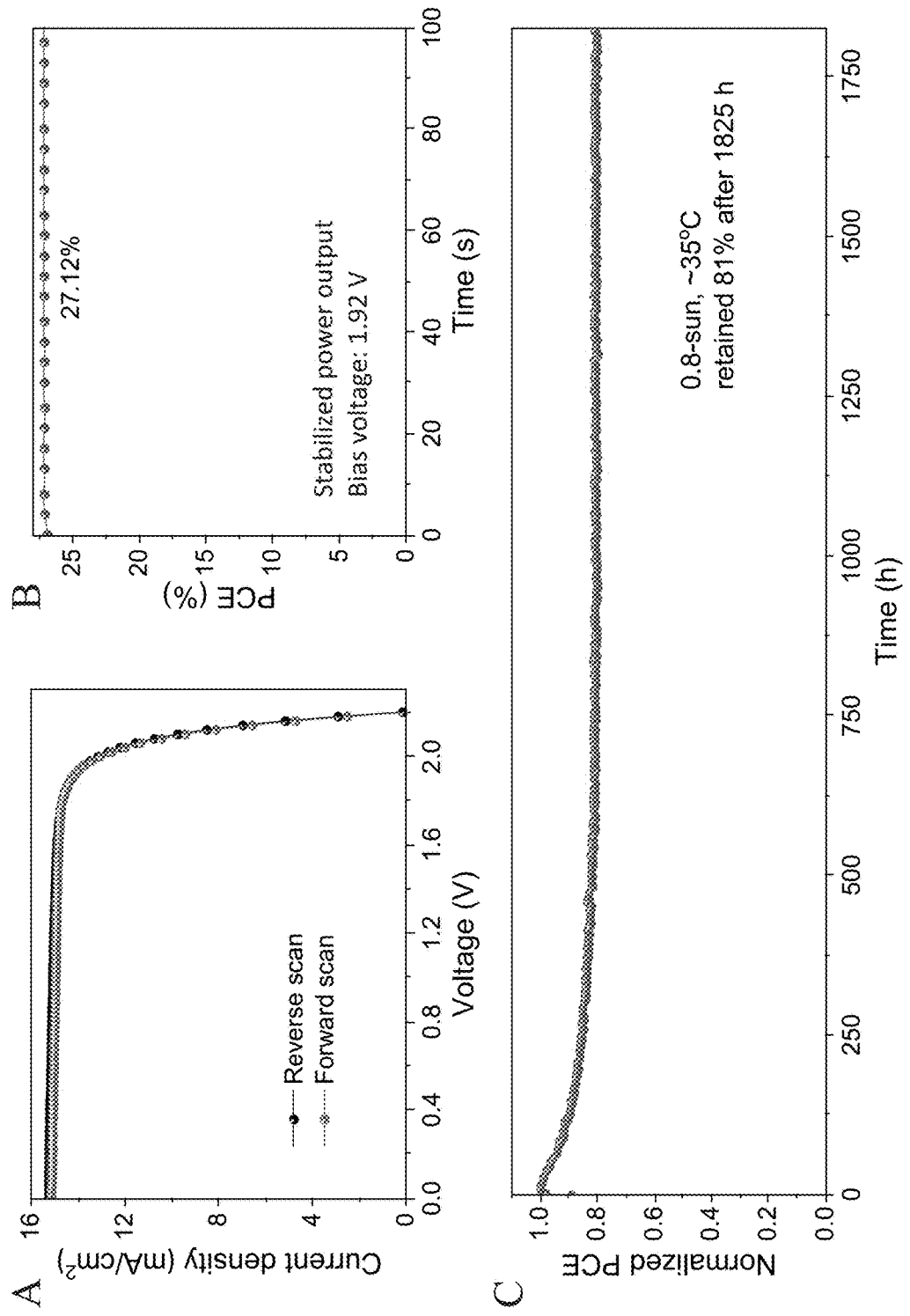
FIG. 23 illustrates characterization data for a tandem device. (A) J-V curves of an all-perovskite tandem solar cell incorporating the gas-quench-based 1.75-eV WBG PSC. The device area was 0.059 cm$^2$ as defined by a metal aperture. (B) The corresponding SPO efficiency near the MPP. The narrow-bandgap bottom cell is based on 1.25-eV Sn—Pb perovskite ($FA_{0.6}MA_{0.4}Sn_{0.6}Pb_{0.4}I_3$). (C) Long-term stability of the tandem device under continuous ~0.8-sun illumination at ~35° C. in $N_2$. The tandem device retained ~81% of its maximum efficiency after 1825 hours.
Figure 24:
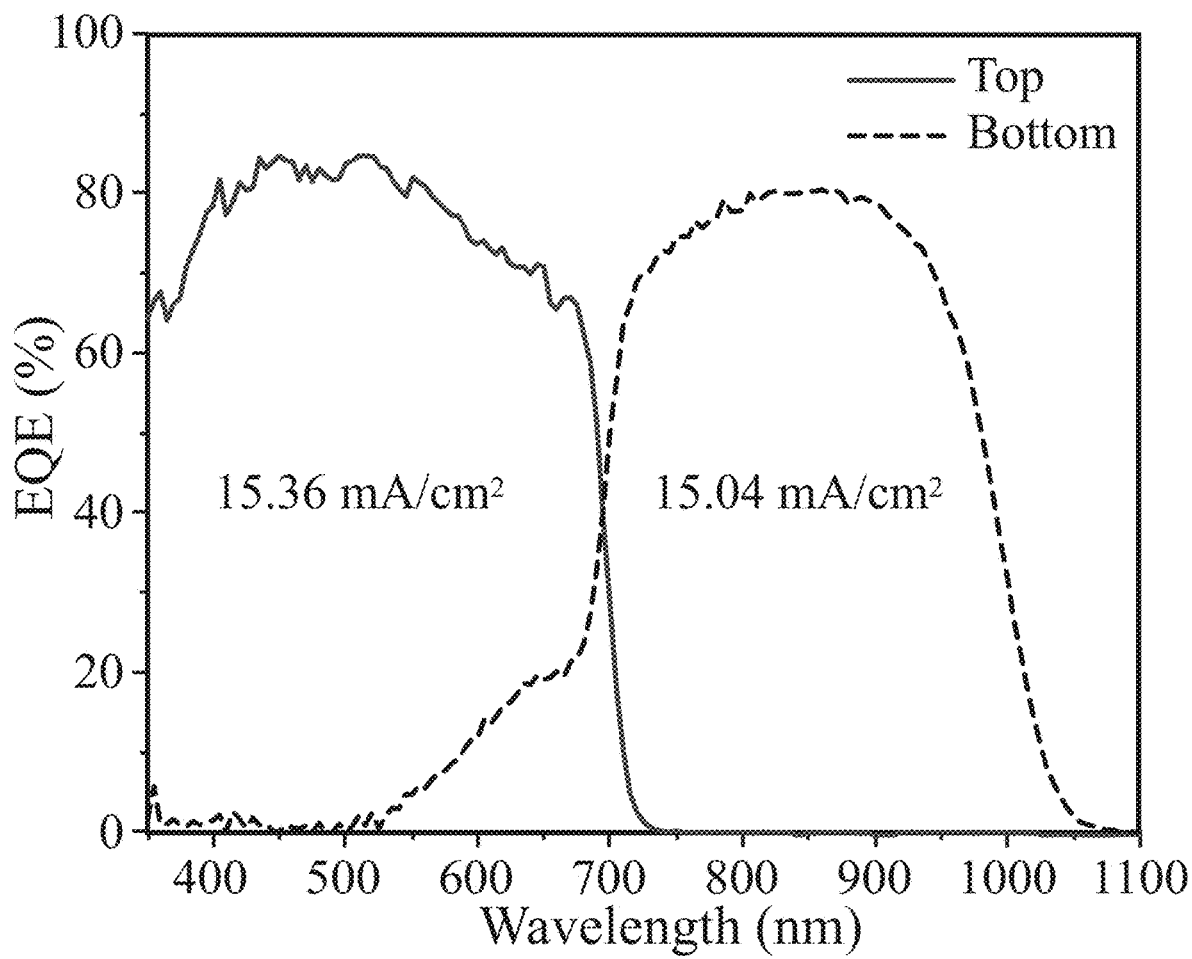
FIG. 24 illustrates external quantum efficiency (EQE) spectra of the top (wide-bandgap) and bottom (narrow-bandgap) subcells in a tandem solar cell.
Figure 25:
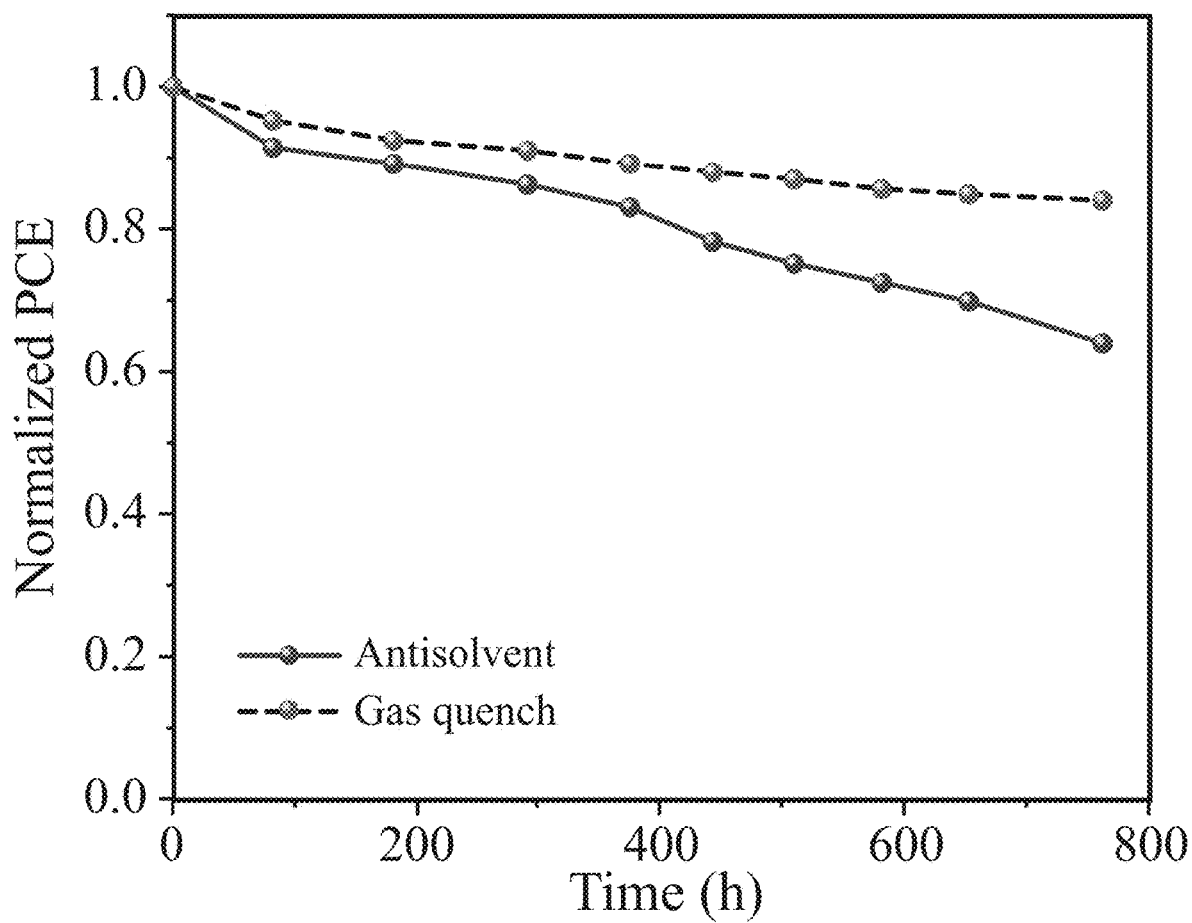
FIG. 25 illustrates a stability comparison of encapsulated all-perovskite 2T tandem devices aged under continuous 1-sun illumination from a sulfur plasma lamp, at about 50° C., in ambient air. The tandem devices were encapsulated with cover glass and epoxy (Gorilla 2-part epoxy 4200130).

To exploit the effectiveness of our optimized WBG perovskites, monolithic all-perovskite tandem solar cells were constructed by combining a 1.25-eV $FA_{0.6}MA_{0.4}Sn_{0.6}Pb_{0.4}I_3$ narrow-bandgap PSC with the best-ing performing 1.75-eV WBG PSC described above. The tandem device stack had the following design of glass/ITO/SAM/1.75-eV perovskite/LiF/$C_{60}$/33-nm $SnO_x$/1-nm Au/PEDOT:PSS/1.25-eV perovskite/$C_{60}$/BCP/Ag, where PEDOT:PSS is poly(3,4-ethylenedioxythiophene):polystyrene sulfonate. The J-V curves of the tandem device (see Panel A of FIG. 23) showed negligible hysteresis between reverse and forward scans. The reverse scan yielded a PCE of 27.1%, with a $J_{sc}$ of 15.3 mA/cm$^2$, $V_{oc}$ of 2.20 V, and FF of 80.8%; the forward scan showed a PCE of 27.2%, with a $J_{sc}$ of 15.1 mA/cm$^2$, $V_{oc}$ of 2.20 V, and FF of 81.6%. The corresponding SPO efficiency reached 27.1% (see Panel B of FIG. 23). The external quantum efficiency (EQE) spectra for the corresponding top and bottom subcells are shown in FIG. 24. The operational stability of the tandem devices was also evaluated. The unencapsulated tandem cell retained ~81% of its maximum PCE after 1825 hours under continuous ~0.8-sun illumination from a sulfur plasma lamp at ~35° C. in N$_2$ (see Panel C of FIG. 23). The encapsulated tandem cell exhibited a T84 of 763 hours when tested at ~50° C. in air (see FIG. 25).

Experimental Methods:

Materials: Cesium iodide (CsI, 99.99% beads), dimethylammonium iodide (DMAI, 98%), tin iodide (SnI$_2$, 99.99%, 10-mesh beads), tin fluoride (SnF$_2$, 99%), guanidine thiocyanate (GASCN, 99%), and were purchased from Sigma-Aldrich. Organic salt of formamidinium iodide (FAI), methylammonium iodide (MAI) and phenethylammonium iodide (PEAI) were purchased from Greatcell Solar Materials (Australia). Self-assembled monolayer materials of [2-(3,6-Dimethoxy-9H-carbazol-9-yl)ethyl]phosphonic Acid (MeO-2PACZ) and [4-(3,6-Dimethyl-9H-carbazol-9-yl)butyl]phosphonic Acid (Me-4PACZ), lead bromide (PbBr$_2$), lead iodide (PbI$_2$), and lead chloride (PbCl$_2$) were purchased from Tokyo Chemical Industry (TCI). Dimethylformamide (DMF, 99.8%, anhydrous), dimethyl sulfoxide (DMSO, 99.9%, anhydrous), ethanol, toluene and methyl acetate were purchased from Sigma-Aldrich. PEDOT:PSS (Heraeus CLEVIOS P VP AI 4083) was purchased from Heraeus Clevios. The evaporating material, lithium fluoride (LiF) was purchased from Alfa Aesar. $C_{60}$ was purchased from Luminescence Technology. Bathocuproine (BCP) was purchased from TCI. All chemicals were used directly as received, without further purification.

Wide-bandgap perovskite precursor preparation: To make wide-bandgap $Cs_{0.3}FA_{0.6}DMA_{0.1}Pb(I_{0.7}Br_{0.3})_3$ precursor with a concentration of 1 M, $PbCl_2$ (0.02 M), DMAI (0.1 M), CsI (0.3 M), FAI (0.6 M), $PbBr_2$ (0.45 M), and $PbI_2$ (0.55 M) were dissolved in mixed solvent of DMF/DMSO (v/v, 3:1). Prior to use, the precursor solution was shaken by a Vortex machine until it was fully dissolved, and no filtration was done before use.

Narrow-bandgap perovskite precursor preparation: To make the narrow-bandgap $FA_{0.6}MA_{0.4}Sn_{0.6}Pb_{0.4}I_3$ with a concentration of 2 M, FAI (1.2 M), $SnI_2$ (1.2 M), $SnF_2$ (0.12 M), MAI (0.8 M), $PbI_2$ (0.8 M), GASCN (0.056 M) and PEAI (0.016 M) were mixed and dissolved into DMF/DMSO (v/v, 4:1). The mixture was shaken with the Vortex machine for about 2 hours and filtered with 0.2-μm polytetrafluoroethylene filters before use, following the procedure detailed in our previous report, which is incorporated herein by reference in its entirety (*Nat. Energy* 7, 642-651 (2022)).

Wide bandgap perovskite solar cell fabrication: To make the single-junction wide-bandgap perovskite solar cells, ITO glass was first cleaned by sequentially washing with acetone and isopropanol (IPA). The ITO substrates were treated with ultraviolet ozone for 15 min before use. Then, the substrates were spin-coated with a self-assembled monolayer of mixed-solution MeO-2PACZ and Me-4PACZ (0.5 mg/mL in ethanol, volume ratio 2:1) at 3000 r.p.m. for 30 s, followed by 10 min of annealing at 100° C. in a nitrogen glovebox. After cooling the substrate, 50 μL of wide-bandgap perovskite precursor was dropped onto the substrate and then spin-coated at 3000 r.p.m. for 60 s. For the anti-solvent method of making the perovskite layer, 160 μL of the methyl acetate anti-solvent was dropped at 15 s during the spinning process. The resulting perovskite film was then annealed at 100° C. for 10 min in an $N_2$ glovebox. For the gas-quench method of making the perovskite layer, a nitrogen gun was vertically positioned ~2 cm above the top of the substrates. The gas flow started after ~20 s of the spin. The gas flow was continued till the film turned dark brown, which should happen for a duration of ~15-20 s when the gas flow pressure was ~40 psi. The flow intensity influences how fast the film starts to turn dark brown. A lower gas flow pressure would need a longer gas quenching duration, without much impact on the device performance. Also, if gas quenching for a longer duration even after the film turns dark, the resulting film would become rough but glossy, also without obvious influence on the device performance. Thus, the time window for $N_2$ gas quenching is wide. Finally, 1 nm of LiF, 30 nm of $C_{60}$, 6 nm of BCP and 100 nm of Ag were sequentially evaporated to finish the device. When preparing devices for stability testing, 33-nm $SnO_2$ deposited by atomic layer deposition (ALD) was used to replace BCP, and no LiF layer was used. Other layers were kept the same. The ALD $SnO_2$ deposition process is detailed in our previous report (*Nat. Energy* 7, 642-651 (2022)).

All-perovskite tandem solar cells fabrication: For monolithic two-terminal all-perovskite tandem solar cell fabrication, details can also be found in our previous report (*Nat. Energy* 7, 642-651 (2022)). In brief, the narrow-bandgap subcell was deposited on top of the wide-bandgap cell. After LiF/$C_{60}$ evaporation on top of the wide-bandgap perovskite film, about 33 nm of ALD $SnO_2$ and 1 nm of evaporated Au were subsequently deposited. Poly(3,4-ethylenedioxythiophene):polystyrene sulfonate (PEDOT:PSS) was spin-coated onto the sample at 5000 r.p.m. and annealed at 120° C. for 20 min in air. After cooling down to room temperature, the substrates were transferred into an $N_2$ glovebox, 80 μL of the $(FASnI_3)_{0.6}(MAPbI_3)_{0.4}$ precursor was spin-coated onto the substrate at 5000 r.p.m. for 30 s, and 350 μL of toluene antisolvent was slowly dripped onto the spinning substrate 10 s after starting the spin. The resulting intermediate perovskite films were then thermally annealed at 100° C. for 10 min. Finally, 30 nm of $C_{60}$, 6 nm of BCP and 100 nm of Ag were sequentially evaporated to finish the device.

Device and stability measurements: The current density-voltage (J-V) characteristics were measured in a $N_2$ glovebox using an AM 1.5G solar simulator (Oriel Sol3A Class AAA). The intensity of the solar simulator was calibrated to 100 mW/cm² using a reference silicon solar cell (Oriel, VLSI standards, certified by NREL PV Performance Calibration group) as detailed in a previous study (*Nat. Energy* 7, 642-651 (2022)). The mismatch factor was 1.03 for the wide-bandgap cell and 0.99 for the narrow-bandgap cell. The evaporated pixel area was 0.112 cm², and a 0.059-cm² mask was used when doing the measurements. For long-term stability measurements, the solar cells were loaded into a custom-built stability measuring system, dubbed the Stability Parameter Analyzer (SPA). In detail, the setup consists of cooling tubes to keep the cell housing at room temperature if needed and a flow chamber to control the environment of the cells, electrical housing and electronics which switch between devices, measure JV curves, and holds the devices under resistive load, and a light source to provide constant illumination. In this study, devices were kept in a Nitrogen environment at different temperatures (25° C., 55° C., and 65° C.) underneath a sulfur plasma lamp at ~0.8-sun or white light emitting diodes at 1.2-sun, and held under a resistive load of 510 Ohms (placing the cells close to maximum power point). Every 30 minutes, the system removes the resistive load and takes a J-V scan using a Keithley 2450 source-measure unit. JV curves are then analyzed to extract relevant parameters. The dark J-V were measured by scanning voltage from forward to reverse bias on a Keithley 238. The sample was probed with sun-side down on a temperature-controlled stage at 25° C. in a light tight enclosure.

Material characterizations: Ultraviolet visible (UV-Vis) absorption spectra were taken on an Agilent Cary-6000i spectrophotometer. The film surface and cross-section morphology were characterized using a Hitachi S4800 scanning electron microscope. The X-ray diffractometer (XRD) patterns of the samples were recorded using Rigaku D-MAX 2200 equipment. The theta/2theta modes were conducted with a Cu $K_\alpha$ radiation and an anode operating at 40 kV and 250 mA. The 2D XRD was collected using a Bruker D8 Discover with a Vantec area detector (sample-to-detector distance of 15 cm) and illuminated with X-rays from a Cu target (40 kV, 35 mA) using a Göebel mirror (parallel optics) and 1 mm circular collimator.

Transient absorption (TA) measurements: Transient absorption (TA) measurements were performed with a Coherent laser (800-nm fundamental beam, 1-kHz rep rate, 3 mJ/pulse, 100-fs pulse width). The fundamental beam was split into a pump and probe pulse through a 50/50 beam splitter. The probe pulse was then sent through a delay line with a time resolution from 150 fs up to 2.5 ns. Finally, the probe pulse was sent through a sapphire crystal to generate a white light super continuum. The pump pulse was doubled using a Palitra Duo OPA to a 3.1-eV excitation pulse. The pump and probe pulses were aligned spatially onto the sample at an approximately 15° angle to one another. A Helios Ultrafast spectrometer was used for detection. The excitation density for all TA measurements was kept so that the initial number of photogenerated charge carriers directly after pump excitation did not exceed ~$4\times10^{13}$ photons/cm$^3$. The pump penetration depth ($d_p$) can be calculated using the equation $d_p=1/\alpha$, where $\alpha$ is the absorption coefficient of the material at the pump excitation wavelength.

Time-resolved microwave conductivity (TRMC) measurement: Anti-solvent- and gas-quench-based perovskite films were prepared in an identical manner to those used in devices, except onto precleaned 25×11×1-mm quartz plates (Technical Glass Products, Inc.). In brief, a 5-ns pulse width, 10-Hz laser at 643 nm was coupled into an X band resonant cavity to photo-generate carriers in each perovskite film, the power from which was measured before and after each measurement using a photothermal detector placed at the sample position and masked by the optical widow and waveguide sections when the sample was present. Each sample was positioned inside the microwave cavity such that excitation was always incident to the quartz side, and continuous nitrogen purge was applied to the cavity during all measurements. Neutral density filters were used to attenuate the beam power over one order of magnitude to below $10^{10}$ cm$^2$ absorbed photon flux. For analysis, each sample's fraction of absorbed light was measured inside an integrating sphere diffuse reflectance accessory (Cary 7000i), whereas the beam attenuation profiles of the filter combinations were extracted from the measured specular transmission data for each neutral density filter at the excitation wavelength.

Time-of-flight secondary-ion mass spectrometry (TOF-SIMS) measurements: An ION-TOF TOF-SIMS V Time of Flight SIMS (TOF-SIMS) spectrometer was used for depth profiling of the perovskite. Analysis was completed utilizing a 3-lens 30 keV BiMn primary ion gun. High mass resolution depth profiles were completed with a 30 KeV $Bi_3^+$ primary ion beam, (0.8 pA pulsed beam current), a 50×50 μm area was analyzed with a 128:128 primary beam raster. Sputter depth profiling was accomplished with 1 keV Cesium ion beam (6 nA sputter current) with a raster of 150×150 microns.

Deep-level transient spectroscopy (DLTS) measurements: DLTS is a capacitance-based technique for detecting and quantifying defect levels due to impurities or crystal imperfections that capture excess carriers, increase carrier recombination, and lead to reduced solar cell performance (68, 69). We utilized a commercial PhysTech (formerly Bio-Rad and Accent Optical Technologies) DLTS system based on capacitance transient fast Fourier transforms (69). For DLTS measurement, the samples with ~4-mm$^2$ area were compared while keeping all DLTS measurement parameters the same. Each sample was held at 0.25 V reverse bias and pulsed to 0.25 V forward bias for a filling pulse width of 100 ms.

Examples

Example 1. A device comprising: a layer comprising a perovskite, wherein: the layer has a first side and a second side defining a thickness, the perovskite has a bulk composition as defined by $AB(X_{1-y}X_y')_3$, where A comprises a first cation, B comprises a second cation, X comprises iodide, and X' comprises bromide, y is between 0.2 and 0.8, inclusively, and the thickness comprises a bromide concentration gradient across the thickness with a maximum concentration at or in the proximity of the first side and a minimum concentration at the second side.

Example 2. The device of Example 1, wherein y is between 0.25 and 0.50, inclusively.

Example 3. The device of either Example 1 or Example 2, wherein the thickness is between 100 nm and 1500 nm.

Example 4. The device of any one of Examples 1-3, wherein the thickness is between 300 nm and 800 nm.

Example 5. The device of any one of Examples 1-4, wherein the first cation comprises at least one of methylammonium (MA), formamidinium (FA), dimethylammonium (DMA), guanidinium, cesium, or rubidium.

Example 6. The device of any one of Examples 1-5, wherein B comprises at least one of lead or tin.

Example 7. The device of any one of Examples 1-6, wherein the perovskite is characterized by a bandgap greater than 1.5 eV.

Example 8. The device of any one of Examples 1-7, wherein the bandgap is between 1.57 eV and 2.1 eV.

Example 9. The device of any one of Examples 1-8, wherein the bandgap is between 1.65 eV and 1.85 eV.

Example 10. The device of any one of Examples 1-9, wherein the first side has no visible perovskite grain boundaries with a characteristic grain length between 100 nm and 1 μm, when viewed by scanning electron microscopy.

Example 11. The device of any one of Examples 1-10, wherein the characteristic grain length is between 100 nm and 500 nm.

Example 12. The device of any one of Examples 1-11, wherein the layer comprises perovskite grains oriented substantially across the thickness.

Example 13. The device of any one of Examples 1-12, wherein the perovskite is characterized by X-ray diffraction by the absence of peaks in at least one of a first range between 17 degrees 2θ and 26 degrees 2θ or a second range between 30 degrees 2θ and 33 degrees 2θ.

Example 14. The device of any one of Examples 1-13, wherein the bromide concentration is evident when testing the layer by transient absorption (TA).

Example 15. The device of any one of Examples 1-14, wherein: the perovskite comprises $FA_{1-a-b}Cs_aDMA_bPb(I_{1-y}Br_y)_3$, a is between 0.01 and 0.7, inclusively, and b is between 0 and 0.2, inclusively.

Example 16. The device of any one of Examples 1-15, wherein a is between 0.05 and 0.5, inclusively.

Example 17. The device of any one of Examples 1-16, wherein b is between 0.1 and 0.2, inclusively.

Example 18. The device of any one of Examples 1-17, further comprising: a layer comprising a self-assembling monolayer (SAM), wherein: the perovskite layer and the SAM layer are positioned in parallel and in physical contact with each other, and the SAM comprises at least one of MeO-2PACZ or Me-4PACZ.

Example 19. The device of any one of Examples 1-18, wherein the SAM layer comprises MeO-2PACZ and Me-4PACZ.

Example 20. The device of any one of Examples 1-19, wherein the MeO-2PACz and the Me-4PACZ are present at a molar ratio between 1:2 and 20:1.

Example 21. The device of any one of Examples 1-20, wherein the ratio is between 1.2 and 8:1.

Example 22. The device of any one of Examples 1-21, wherein the ratio is between 1:1 and 2:1.

Example 23. A method comprising: contacting a surface of a liquid layer with a gas, wherein: the liquid layer comprises a first cation (A), a second cation (B), iodide (X), and bromide (X'), the contacting results in the transforming of the liquid layer to a solid perovskite layer having a bulk composition defined by $AB(X_{1-y}X_y')_3$, and y is between 0.2 and 0.8, inclusively.

Example 24. The method of Example 23, wherein y is between 0.25 and 0.50, inclusive.

Example 25. The method of either Example 23 or Example 24, wherein gas comprises at least one of an inert gas or air.

Example 26. The method of any one of Examples 23-25, wherein the inert gas comprises at least one of nitrogen, argon, or xenon.

Example 27. The method of any one of Examples 23-26, wherein the air is substantially free of water.

Example 28. The method of any one of Examples 23-27, wherein the gas is provided at a temperature between 20° C. and 100° C.

Example 29. The method of any one of Examples 23-28, wherein the temperature is between 20° C. and 30° C.

Example 30. The method of any one of Examples 23-29, wherein the temperature is between 22° C. and 24° C.

Example 31. The method of any one of Examples 23-30, wherein the gas is provided at a supply pressure between 20 psig and 70 psig.

Example 32. The method of any one of Examples 23-31, wherein the supply pressure is between 30 psig and 40 psig.

Example 33. The method of any one of Examples 23-32, wherein, at the start of the contacting, the liquid layer is provided at a temperature between 20° C. and 100° C.

Example 34. The method of any one of Examples 23-33, wherein the liquid layer temperature is between 20° C. and 30° C.

Example 35. The method of any one of Examples 23-34, wherein the liquid layer temperature is between 22° C. and 24° C.

Example 36. The method of any one of Examples 23-35, wherein the contacting is performed for a period of time between 1 second and 1 hour.

Example 37. The method of any one of Examples 23-36, wherein the period of time is between 10 seconds and 100 seconds.

Example 38. The method of any one of Examples 23-37, wherein the period of time is between 20 seconds and 30 seconds.

Example 39. The method of any one of Examples 23-38, further comprising after the contacting, heating the solid perovskite layer.

Example 40. The method of any one of Examples 23-39, wherein the heating is performed by heating the solid perovskite layer to a temperature between 40° C. and 200° C.

Example 41. The method of any one of Examples 23-40, wherein the temperature of the heating is between 80° C. and 150° C.

Example 42. The method of any one of Examples 23-41, wherein the temperature of the heating is between 90° C. and 120° C.

Example 43. The method of any one of Examples 23-42, wherein the heating is performed for a period of time between one second and one hour.

Example 44. The method of any one of Examples 23-43, wherein the period of time for the heating is between 5 minutes and 15 minutes.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
a perovskite layer comprising a $FA_{1-a}Cs_aPb(I_{1-y}Br_y)_3$, and
a layer comprising a self-assembling monolayer (SAM), wherein: FA is formamidinium
the perovskite layer has a first side and a second side defining a thickness,
the first side has no visible perovskite grain boundaries with a characteristic grain length between 100 nm and 1 µm, when viewed by scanning electron microscopy,
the second side of the perovskite layer is positioned adjacent to the SAM,
the perovskite layer and the SAM are positioned in parallel and in physical contact with each other, the SAM comprises 2-(3,6-dimethoxy-9H-carbazol-9-yl)
ethyl)phosphonic acid (MeO-2PACZ) and 4-(3,6-dimethyl-9H-carbazol-9-yl)butyl)phosphonic acid (Me-4PACZ), $0.2 \leq y \leq 0.8$, $0.01 \leq a \leq 0.7$, and the thickness comprises a bromide concentration gradient across the thickness with a maximum concentration at or in the proximity of the first side and a minimum concentration at the second side.

2. The device of claim 1, wherein the thickness is between 100 nm and 1500 nm.

3. The device of claim 1, wherein the perovskite layer further comprises tin.

4. The device of claim 1, wherein the perovskite layer is characterized by a bandgap greater than 1.5 eV.

5. The device of claim 1, wherein the perovskite layer comprises perovskite grains oriented substantially across the thickness.

6. The device of claim 1, wherein the perovskite layer is characterized by X-ray diffraction by the absence of peaks in at least one of a first range between 17 degrees 2θ and 26 degrees 2θ or a second range between 30 degrees 2θ and 33 degrees 2θ.

7. The device of claim 1, wherein the bromide concentration is evident when testing the layer by transient absorption (TA).

8. The device of claim 1, wherein the MeO-2PACz and the Me-4PACZ are present at a molar ratio between 1:2 and 20:1.

9. The device of claim 1, wherein the perovskite layer further comprises at least one of methylammonium (MA), dimethylammonium (DMA), guanidinium, or rubidium.

10. The device of claim 9, wherein
the perovskite comprises $FA_{1-a-b}Cs_aDMA_bPb(I_{1-y}Br_y)_3$ and $0.01 \leq b \leq 0.2$.

11. A method comprising:
forming a self-assembling monolayer (SAM) on a substrate;
depositing a liquid layer of a solution comprising a perovskite precursor onto the SAM;
contacting a surface of the liquid layer with a gas, wherein:

the contacting results in the transforming of the liquid layer to a solid perovskite layer comprising $FA_{1-a}Cs_aPb(I_{1-y}Br_y)_3$, $0.2 \leq y \leq 0.8$, $0.01 \leq a \leq 0.7$, the solid perovskite layer has a first side and a second side defining a thickness, the first side has no visible perovskite grain boundaries with a characteristic grain length between 100 nm and 1 μm, when viewed by scanning electron microscopy, the second side of the solid perovskite layer is positioned adjacent to the SAM, the solid perovskite layer and the SAM are positioned in parallel and in physical contact with each other, the SAM layer comprises 2-(3,6-dimethoxy-9H-carbazol-9-yl)ethyl)phosphonic acid (MeO-2PACZ) and 4-(3,6-dimethyl-9H-carbazol-9-yl)butyl)phosphonic acid (Me-4PACZ), and the thickness comprises a bromide concentration gradient across the thickness with a maximum concentration at or in the proximity of the first side and a minimum concentration at the second side.

12. The method of claim 11, wherein the gas comprises at least one of an inert gas or air.

13. The method of claim 11, wherein the gas is provided at a temperature between 20° C. and 100° C.

14. The method of claim 11, wherein the gas is provided at a supply pressure between 20 psig and 70 psig.

15. The method of claim 11, wherein, at the start of the contacting, the liquid layer is provided at a temperature between 20° C. and 100° C.

16. The method of claim 11, wherein the solid perovskite layer comprises perovskite grains oriented substantially across the thickness.

17. The method of claim 11, wherein the solid perovskite layer is characterized by X-ray diffraction by the absence of peaks in at least one of a first range between 17 degrees 2θ and 26 degrees 2θ or a second range between 30 degrees 2θ and 33 degrees 2θ.

18. The method of claim 11, wherein the contacting is performed for a period of time between 1 second and 1 hour.

19. The method of claim 18, wherein the period of time is between 10 seconds and 100 seconds.

\* \* \* \* \*